United States Patent
Fujita et al.

(10) Patent No.: US 6,709,800 B2
(45) Date of Patent: Mar. 23, 2004

(54) PRESENSITIZED PLATE FOR PREPARING LITHOGRAPHIC PRINTING PLATE

(75) Inventors: Kazuo Fujita, Shizuoka-Ken (JP); Shiro Tan, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 23 days.

(21) Appl. No.: 10/211,372

(22) Filed: Aug. 5, 2002

(65) Prior Publication Data

US 2003/0148209 A1 Aug. 7, 2003

(30) Foreign Application Priority Data

Aug. 16, 2001 (JP) ........................ 2001-247352

(51) Int. Cl.[7] .................. G03F 7/033; G03F 7/021; G03F 7/012; G03F 7/038; G03F 7/32
(52) U.S. Cl. ................... 430/270.1; 430/176; 430/192; 430/197; 430/271.1; 430/281.1; 430/302; 430/907; 430/910

(56) References Cited

U.S. PATENT DOCUMENTS

| | | | |
|---|---|---|---|
| 4,822,713 A | * | 4/1989 | Nishioka et al. ............ 430/907 |
| 6,110,640 A | * | 8/2000 | Kawamura et al. ......... 430/910 |
| 6,423,467 B1 | * | 7/2002 | Kawauchi et al. .......... 430/907 |
| 2002/0102490 A1 | * | 8/2002 | Ito et al. .................... 430/907 |

FOREIGN PATENT DOCUMENTS

| | | | |
|---|---|---|---|
| JP | 54/135004 | * | 10/1979 |
| JP | 62/170950 | * | 6/1987 |
| JP | 08/015858 | * | 1/1996 |
| JP | 2000/187138 | * | 7/2000 |

* cited by examiner

Primary Examiner—Richard Schilling
(74) Attorney, Agent, or Firm—Burns, Doane, Swecker & Mathis, LLP

(57) ABSTRACT

A presensitized plate for preparing a lithographic printing plate comprises a substrate provided thereon with a light-sensitive layer containing a fluoro-aliphatic group-containing copolymer prepared by copolymerizing at least (A) an addition polymerizable monomer having, on a side chain, a fluoro-aliphatic group in which hydrogen atoms are replaced with fluorine atoms and (B) a (meth)acrylate having an ester chain represented by a specific general formula. The use of the foregoing specific fluorine atom-containing polymer permits the formation of a light-sensitive layer having uniform surface condition without causing abnormality in the surface quality due to the foaming phenomenon observed during the production and also permits the production of a positive light-sensitive resin composition having excellent solubility and dispersibility in a developer.

10 Claims, No Drawings

PRESENSITIZED PLATE FOR PREPARING LITHOGRAPHIC PRINTING PLATE

BACKGROUND OF THE INVENTION

The present invention relates to a novel presensitized plate for preparing a lithographic printing plate, whose light-sensitive layer includes a fluoro-aliphatic group-containing copolymer (hereunder also referred to as "fluorine atom-containing polymer") and more specifically to a presensitized plate for preparing a lithographic printing plate, which may have uniform coated surface conditions without causing any defect during preparation such as foaming and which can provide a lithographic printing plate excellent in the developing ability and ink-receiving properties. The present invention also relates to a method for preparing a lithographic printing plate from the presensitized plate described above.

A presensitized plate for preparing a lithographic printing plate has a construction in which a light-sensitive composition (an image-forming composition) is coated on a substrate. A typical production process thereof comprises the steps of applying a light-sensitive composition dissolved or dispersed in an organic solvent onto a substrate, which has been subjected to an appropriate surface treatment and/or which has been provided with an undercoating layer and/or a back coating layer, optionally applying a top coat (or upper) layer such as a protective layer and then drying. In addition, a typical plate-making process comprises the steps of inducing an imagewise change in physical properties of a light-sensitive composition applied onto a substrate by the contact- or projection-type imagewise surface exposure through a mask carrying an image or direct exposure according to, for instance, the scanning or modulation of electromagnetic waves based on image information outputted from a computer, removing (or developing) the light-sensitive layer on the un-exposed areas, followed by, for instance, optional hydrophilization, lipophilization and formation of a protective film to thus form a lithographic printing plate comprising non-image areas or the exposed hydrophilic substrate surface and image areas or the surface of the hydrophobic light-sensitive layer. In a typical printing step, the hydrophilic non-image areas on the lithographic printing plate thus prepared receives dampening water, while the hydrophilic image areas formed thereon receives ink to thus form ink images on the surface of the printing plate. The resulting ink images are directly or indirectly transferred to a desired printing medium to thus form printed matters.

Regarding the light-sensitive layer (image-forming layer) used in such a presensitized plate, there have been known a wide variety of techniques relating to, for instance, light-sensitive layers, which make use of changes in physical properties upon exposure to light, such as negative type one in which the initially soluble type layer is converted into insoluble one upon exposure to light and positive type one in which the initially insoluble type layer is converted into soluble one as well as light-sensitive layers, which make use of, for instance, optical reactions, heat mode processes and heat-sensitive recording as the principle for inducing such physical property changes. To prepare a highly useful presensitized plate for lithographic printing plates, irrespective of the kind of the light-sensitive layer selected, a common technical problem arises. More specifically, (1) the light-sensitive layer should have a high uniformity; and (2) the image area should have a high hydrophobicity and the non-image area should easily be removed through development. The uniformity of the image area is mainly ascribed to the foregoing preparation process, from the technical standpoint and the presensitized plate insufficient in the uniformity is not preferred since it never satisfies such a basic requirement that the printing plate prepared from the presensitized plate should stably provide a large number of printed matters carrying uniform images of high quality. Moreover, the image area preferably has a high hydrophobicity, since this results in the improvement of the resistance thereof to a developer, ensures excellent resolution in the plate-making step and also permits the achievement of sufficient printing durability and sufficient ink-receptivity. However, extremely high hydrophobicity of the image area may result in the reduction of the solubility thereof in an alkaline aqueous solution as a commonly used developer and this may in turn lead to undesirable results such as the insufficient development of non-image areas and the generation of sludge components in the developer. More specifically, the light-sensitive layer should simultaneously satisfy two requirements contradictory to one another, i.e., the hydrophobicity of the image area and the easy removability of the non-image area. The development of a technique, which can satisfy these two requirements at the same time, is quite difficult and has been an important problem to be solved.

It has been known that the use of a composition containing a fluoro-aliphatic group-containing high molecular weight compound as a light-sensitive composition is quite effective for solving such a technical problem. For instance, Japanese Un-Examined Patent Publication (hereunder referred to as "J.P. KOKAI") No. Sho 54-135004 discloses that the use of such a composition is effective as a technique for improving the uniformity of an image-forming layer. In addition, J.P. KOKAI Nos. Sho 62-170950, Hei 8-15858 and 2000-19724 disclose the usefulness of the copolymer comprising fluoro-aliphatic group-containing monomer units and specific functional group-containing monomer units. These techniques permit the elimination of the insufficiency of the prior arts, which disclose the use of a fluoro-aliphatic group-containing polymer compound, by the selection of additional substituents. In other words, these techniques are those for reducing the adverse effect of such a fluoro-aliphatic group-containing polymer on the plate-making and printing processes or, contrary to this, those for making the most use of the effect of the polymer. More specifically, J.P. KOKAI Sho 62-170950 discloses further improvement of the film-uniformizing function due to the improvement of the surface activity of the light-sensitive layer; J.P. KOKAI Hei 8-15858 discloses the elimination of the slow developing ability due to the hydrophobicity, while making use of such a polymer; and J.P. KOKAI 2000-19724 discloses the contrast image-forming effect achieved by the simultaneous satisfaction of the two contradictory requirements or the requirements for the hydrophobicity of the image area and the easy removability of the non-image area, while making use of the hydrophobicity-orientating ability.

Furthermore, it is also possible to device a means for improving the fluoro-aliphatic group-containing polymer other than the selection of copolymerizable components. For instance, J.P. KOKAI 2000-187318 discloses that the use of a polymer compound derived from monomers having at least two fluoro-aliphatic groups may provide an image-forming material having excellent ability of discrimination between the solubilities of the image and non-image areas.

As has been discussed above, the use of a light-sensitive layer containing a fluoro-aliphatic compound is effective as a method for eliminating the foregoing technical problems (1) and (2) common to the light-sensitive layer for a presensitized plate used for preparing a lithographic printing plate. On the other hand, however, the effect has still been insufficient and the development of a further improved such technique has still been desired.

For instance, when using a positive type light-sensitive layer, preferably used for preparing good printed matters are light-sensitive layers having a high ability of discrimination between the image and non-image areas or a high gradation (high contrast) obtained after exposing them to light and then developing from the viewpoint of the image reproduction and the resistance to defects and there have been desired for the development of a light-sensitive layer having a high sensitivity, an ability of preventing the formation of an indistinct image during printing, safety for the light emitted from an incandescent electric lamp and a high acceptability for development, but there has not yet been developed any satisfactory technique.

In this respect, the term "soft tone image" herein used means that when exposing a light-sensitive layer to light through a step wedge and then developing the exposed light-sensitive layer, the difference between the step number at which images begin to remain on the substrate and that at which the film completely remains thereon is large. On the other hand, the term "high contrast image" herein used means that the foregoing difference is small.

Regarding the term "formation of an indistinct image during printing", gases are generated due to the decomposition of the light-sensitive material, this in turn leads to the swelling of the litho-film, this further makes the complete contact exposure of the light-sensitive layer impossible and such a phenomenon is accordingly caused. In general, when the clear-sensitivity is set at the same level, the higher the contrast of images, the easier the elimination of the formation of an indistinct image. Moreover, the term "safety for the light emitted from an incandescent electric lamp is defined to be the stability in sensitivity of images upon exposure of a printing plate to light emitted from an incandescent electric lamp such as a fluorescent lamp and in general, the higher the contrast of images, the higher the safety for the light emitted from an incandescent electric lamp. In this respect, the step wedge is a slender rectangular film whose density increases by 0.15 per step and used for determining the relation between the quantity of exposed light and the amount of the light-sensitive layer remaining after the exposure thereof to light and the subsequent development thereof. The term "clear-sensitivity" used herein means the sensitivity observed when an image begins to form after the exposure thereof to light and the subsequent development thereof. In addition, the term "acceptability for development" is used for evaluating any change in the sensitivity of images after the exposure to light and the subsequent development, when the concentration of the developer used undergoes a change and, in general, the smaller the change in the sensitivity, the higher the acceptability for development.

A photo-polymerizable printing plate, which comprises a photopolymerization initiator and a polymerizable double bond-containing monomer and is typical of the negative type lithographic printing plate, in particular, a printing plate highly sensitive to laser beams whose wavelength falls within the visible light range and which can directly be imagewise exposed to a laser beam, the gradation thereof has been soft and therefore, the presensitized plate easily causes fogging due to scattered light and/or reflected light, when imagewise exposing such presensitized plate using an inner drum-type laser plate setter, in which the imagewise exposure is performed by fixing such a printing plate and rotating a mirror at a high speed. In general, the printing durability of a printing plate is improved by exposing to light rays having a high energy, but the aforementioned fogging caused due to scattered light and/or reflected light becomes conspicuous in case of the photopolymerizable printing plate, the quantity of exposed light cannot be increased and as a result, the printing durability of the resulting printing plate cannot be improved. For this reason, it is necessary for the improvement of the printing durability to increase the quantity of light for imagewise exposure and at the same time, to prevent the occurrence of any fogging due to scattered light and/or reflected light. In case of imagewise exposure using a laser beam, the light-sensitive layer is exposed to laser beam for a time on the order of about 1 $\mu$s per dot, while the fogging due to scattered light and/or reflected light is a phenomenon in which a light-sensitive material is exposed to extremely weak light rays over a long period of time on the order of several minutes and the light-sensitive layer is thus cured. Therefore, to make the gradation high contrast may be a means for preventing the fogging. If making the gradation of a light-sensitive material high contrast, it is difficult to optically cure the material with weak light rays and therefore, the light-sensitive material exposed to weak light can be removed through development and the use of such a high contrast light-sensitive material would permit the inhibition of any fogging.

In addition, in case of heat-sensitive lithographic printing plate, which is imagewise exposed to, for instance, an IR laser beam, the discrimination between the image and non-image areas is low or such a heat-sensitive printing plate has a low gradation (soft tone). Therefore, the heat-sensitive printing plate suffers from various problems in that a developer easily penetrates into the portion on the plate, which comes in contact with the hand, that some of images are skipped during development and that the resulting printing plate shows a low resistance to external defects.

SUMMARY OF THE INVENTION

Accordingly, it is an object of the present invention to provide a technique for achieving the foregoing subjects (1) and (2) to a level superior to that achieved by the conventional techniques. More specifically, the object of the present invention is to provide a presensitized plate for preparing a lithographic printing plate, which is provided with a light-sensitive layer whose uniformity and solubility or dispersibility in a developer are improved and which has an ability of forming high contrast images without entraining any reduction of the sensitivity. It is also an object of the present invention to provide a method for preparing a lithographic printing plate from the presensitized plate described above.

The inventors of this invention have conducted various studies to accomplish the foregoing object and have found that the foregoing object can effectively be achieved by the addition of a specific fluorine atom-containing polymer to a light-sensitive layer. More specifically, the present invention has been completed on the basis of the facts discovered through the detailed investigations of specific fluoro-aliphatic groups and copolymerizable components.

The present invention relates to a presensitized plate for preparing a lithographic printing plate, which comprises a substrate provided thereon with a light-sensitive layer containing a fluoro-aliphatic group-containing copolymer prepared by copolymerizing at least the following monomers (A) and (B):

(A) an addition polymerizable monomer having, on a side chain, a fluoro-aliphatic group in which hydrogen atoms are replaced with fluorine atoms; and (B) a (meth)acrylate having an ester chain represented by the following general formula (I) or (II):

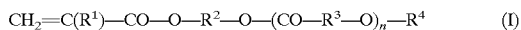

$$CH_2=C(R^1)—CO—O—R^2—O—(CO—R^3—O)_n—R^4 \quad (I)$$

$$CH_2=C(R^1)—CO—(O—R^3—CO)_n—O—R^4 \quad (II)$$

(In the formulas, $R^1$ represents —H or —$CH_3$; $R^2$ and $R^3$ each independently represents an alkylene group having 1 to 12 carbon atoms; $R^4$ represents a hydrogen atom or a substituted or unsubstituted alkyl group having 1 to 12 carbon atoms, a cycloalkyl group, an aryl group, an aralkyl group or a heterocyclic group and n is a number ranging from 1 to 50). This presensitized plate has been found to show excellent effects with respect to the foregoing technical subjects (1) and (2). More specifically, the presensitized plate comprises a positive type light-sensitive resin composition, has uniform coated surface conditions without causing any abnormality in the surface quality of the plate due to the foaming encountered when preparing the same and is further excellent in the solubility or dispersibility in a developer.

Moreover, it has also become clear that a negative type presensitized plate for lithographic printing plates is improved not only in the surface quality and the solubility in a developer as has already been discussed above, but also in the gradation by the addition of a fluorine atom-containing polymer to the light-sensitive layer according to the present invention and that the use of such a polymer would permit the preparation of, in particular, a laser light-sensitive photopolymerizable presensitized plate quite sensitive to laser light beams and excellent in the ability of preventing any fogging due to the scattered light and/or reflected light and also permit the preparation of a printing plate having a high printing durability.

Moreover, in case of a heat-sensitive presensitized plate for a lithographic printing plate, it has also become clear that the use of such a fluorine atom-containing polymer would permit the improvement not only in the surface quality and the solubility in a developer as has already been discussed above, but also in the discrimination between the image and non-image areas and the strength of the images formed. Accordingly, it has been confirmed that the presensitized plate never causes any missing of images formed on the portion of the plate, which comes in contact with the hand, and can provide a printing plate whose stability to external defects is substantially improved.

Among such effects achieved through the use of such a fluorine atom-containing polymeric compound, the ability of forming a uniform film may be ascribed to the surface activity of the polymeric compound or the ability of reducing the surface tension of a dispersion of a light-sensitive composition in an organic solvent used in the presensitized plate-making process. In addition, other effects accomplished by the use of the fluorine atom-containing polymer compound may be ascribed to the high hydrophobicity of the polymer compound included in the light-sensitive layer of the presensitized plate for lithographic printing plates and the abilities of the polymer compound to undergo orientation, one-sided distribution and localization on the surface of the light-sensitive layer. In other words, when incorporating the fluorine atom-containing polymer compound into a light-sensitive composition, the compound may relatively preferentially be distributed in the proximity to the surface of the light-sensitive layer and therefore, the polymer compound can impart a high hydrophobicity to the surface of the light-sensitive layer, while maintaining the overall easy removability of the layer through development.

These properties (uniform film-forming ability and high hydrophobicity of the surface) also widely vary depending on the kinds of copolymerizable components used and the incorporation of the ester chains represented by Formulas (I) and (II) into the polymer compound through copolymerization would permit the improvement of the uniform film-forming ability and the simultaneous satisfaction of the foregoing requirements for the hydrophobicity of image areas and the easy removability of non-image areas. Moreover, the use of such a polymer compound likewise permits the formation of images whose contrast is further improved and the improvement of the ink receptivity due to such an improved hydrophobicity of the image areas.

DESCRIPTION OF THE PREFERRED EMBODIMENTS

The polymer compound carrying, on the side chains, fluoro-aliphatic groups (hereunder also referred to as "fluorine atom-containing polymer") used in the present invention will hereunder be described in more detail.

The fluorine atom-containing polymer used in the present invention is a fluoro-aliphatic group-containing copolymer prepared by copolymerizing the foregoing monomers (A) and (B). The details of monomers (A) and (B) will be described below.

The addition polymerizable monomer moiety in the addition polymerizable monomer (A) having fluoro-aliphatic groups in which hydrogen atoms on carbon atoms are replaced with fluorine atoms, usable herein, may be a vinyl monomer carrying a radical polymerizable unsaturated group. Among such vinyl monomers, preferably used herein are, for instance, acrylate, methacrylate, acrylamide, methacrylamide, styrenic and vinylic monomers. Specific examples of acrylates and methacrylates carrying fluoro-aliphatic groups bonded thereto are compounds represented by the general formula: Rf—R'—OOC—C(R")=$CH_2$ (wherein R' represents, for instance, a single bond, an alkylene group, a sulfonamide-alkylene group or a carbonamide-alkylene group; R" represents a hydrogen or halogen atom or a methyl group; and Rf represents a perfluoro-aliphatic group).

Specific examples thereof include those disclosed in, for instance, U.S. Pat. Nos. 2,803,615, 2,642,416, 2,826,564, 3,102,103, 3,282,905 and 3,304,278; J.P. KOKAI Nos. Hei 6-256289, Sho 62-1116, Sho 62-48772, Sho 63-77574 and Sho 62-36657; and those disclosed in J. Chem. Soc. of Japan, 1985, No. 10, pp. 1884–1888. In addition to these monomers to which fluoro-aliphatic groups are linked, preferably used herein also include macromers to which fluoro-aliphatic groups are linked, disclosed in Reports Res. Lab. Asahi Glass Co. Ltd., 1984, 34:27–34. Moreover, the fluoro-aliphatic group-containing monomers usable herein also include mixtures of monomers whose perfluoroalkyl groups have different lengths represented by, for instance, the following structural formula:

$$CH_2=CH—CO—OCH_2CH_2(CF_2)_nF \text{ (n=6, 8, 10, 12)}$$

In particular, at least one of the fluoro-aliphatic groups present on side chains of the monomer used in the present invention is preferably one derived from a fluoro-aliphatic compound according to the telomerization method (also referred to as "telomer method") or oligomerization method (also referred to as "oligomer method"). The methods for preparing these fluoro-aliphatic compounds are detailed in, for instance, "Synthesis and Functions of Fluorine Atom-Containing Compounds", 1987, edited by ISHIKAWA Nobuo, published by CMC Publishing Company, pp. 117–118; and "Chemistry of Organic Fluorine Compounds II", 1995, edited by Milos Hudlicky & Attila E. Pavlath, American Chemical Society, pp. 747–752. The telomerization method is a technique for preparing a telomer, which comprises the step of subjecting fluorine-containing vinyl compounds such as tetrafluoro-ethylene in the presence of an alkyl halide such as an iodide having a high chain transfer coefficient as a telogen an example thereof is shown in the following reaction scheme-1).

Reaction Scheme-1:

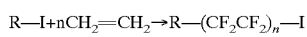

The resulting telomer carrying a terminal iodine atom is in general chemically modified and converted into a fluoro-aliphatic compound according to, for instance, the following "reaction scheme 2". Further, these compounds are optionally converted into those having desired monomer structures and used in the preparation of fluoro-aliphatic group-containing polymers.

Incidentally, a part of the fluorine-containing chemical products prepared by the electrolytic fluorination method, which has favorably been used, are less biodegradable, are substances highly biologically accumulative, and may be harmful to fecundity and to growth, although the extent thereof is low. For this reason, the fluorine-containing chemical products prepared by the telomerization method (also referred to as "telomer method") or the oligomerization method (also referred to as "oligomer method") are substances having high safety to the environment and this is quite advantageous from the industrial standpoint.

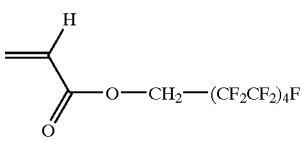
(F-3)

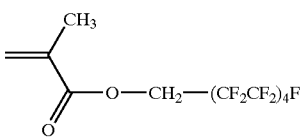
(F-4)

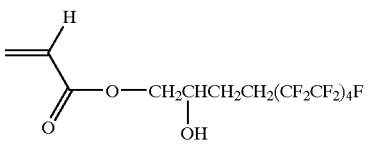
(F-5)

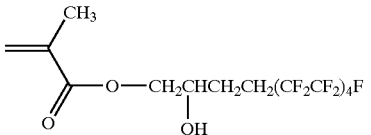
(F-6)

REACTION SCHEME-2

R—(CF₂CF₂)n—I

CH₂=CH₂ ↙   ↘ CH₂=CHCH₂OH

R—(CF₂CF₂)n—CH₂CH₂—I     R—(CF₂CF₂)n—CH₂CH—CH₂
                                        \\O/

R—(CF₂CF₂)n—CH₂CH₂—OH    R—(CF₂CF₂)n—CH=CH₂ → R—(CF₂CF₂)n—CO₂H

Specific examples of such fluoro-aliphatic group-containing monomers include those listed below:

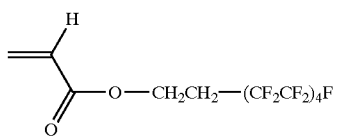
(F-1)

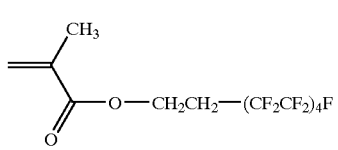
(F-2)

-continued

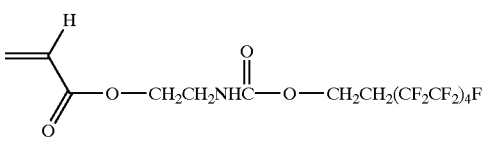
(F-7)

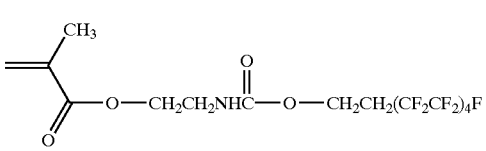
(F-8)

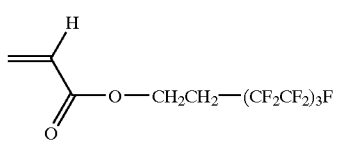
(F-9)
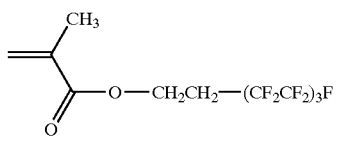
(F-10)
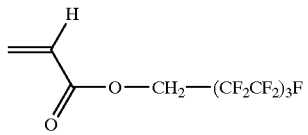
(F-11)
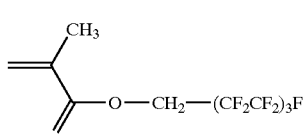
(F-12)
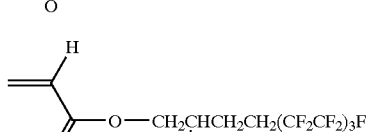
(F-13)
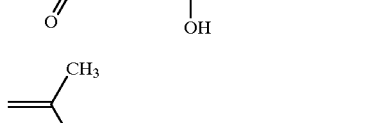
(F-14)
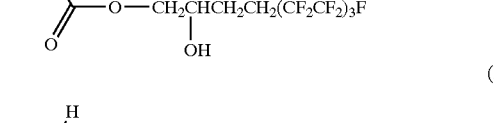
(F-15)
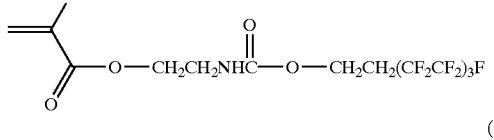
(F-16)
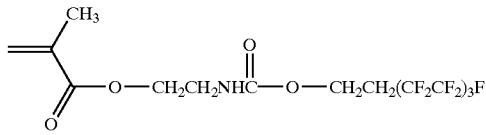
(F-17)
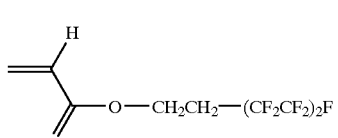
(F-18)
(F-19)
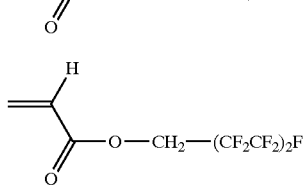
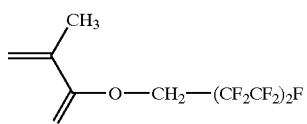
(F-20)
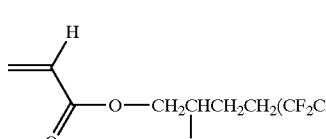
(F-21)
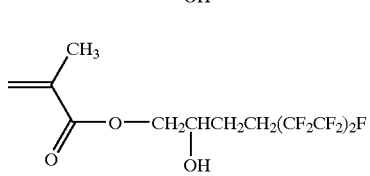
(F-22)
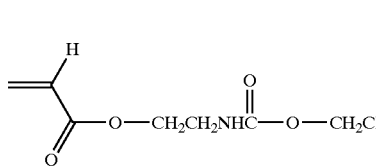
(F-23)
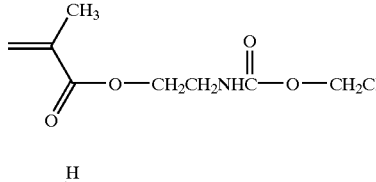
(F-24)
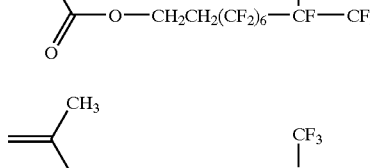
(F-25)
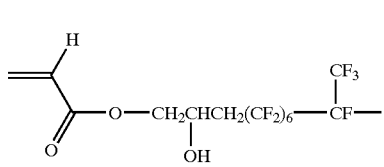
(F-26)
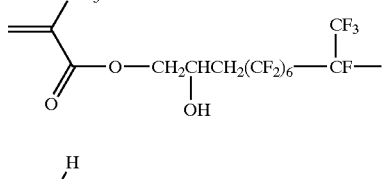
(F-27)
(F-28)
(F-29)

-continued

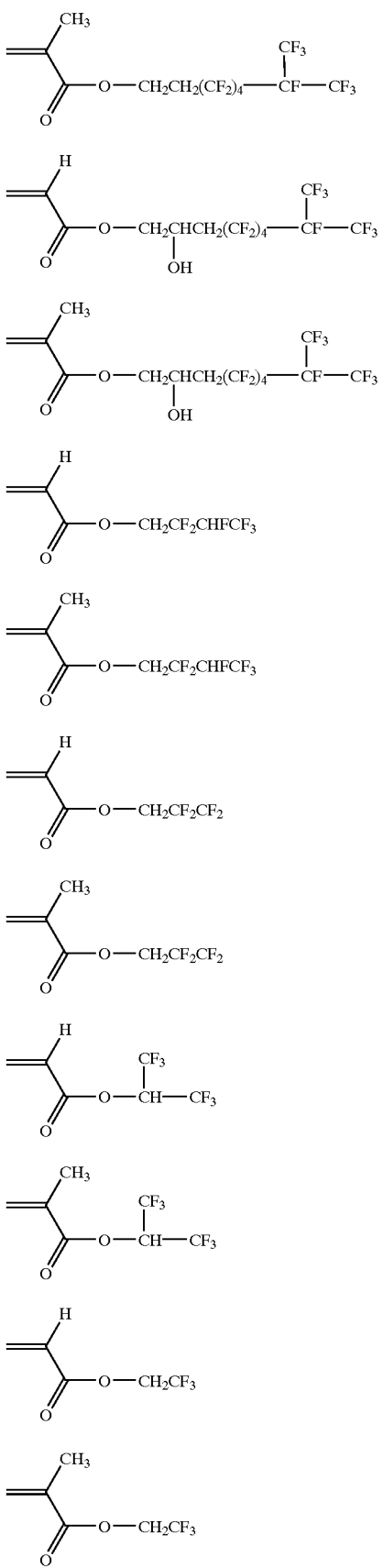

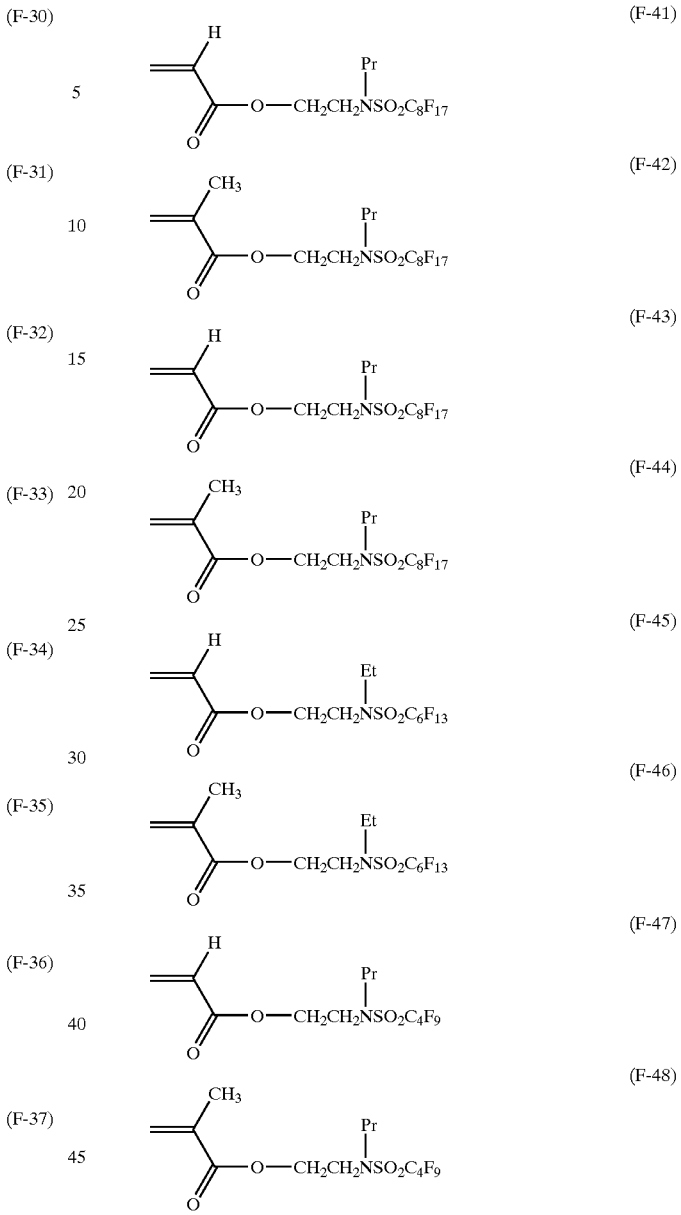

Then the (meth)acrylate (B) carrying a polyester chain used in the fluorine-containing polymer of the present invention as an essential component will be described below in detail.

Example of such (meth)acrylate (B) carrying a polyester chain are compounds represented by the following general formula (I) or (II):

$$CH_2=C(R^1)-CO-O-R^2-O-(CO-R^3-O)_n-R^4 \quad (I)$$
$$CH_2=C(R^1)-CO-(O-R^3-CO)_n-O-R^4 \quad (II)$$

(In the formulas, $R^1$ represents —H or —$CH_3$; $R^2$ and $R^3$ each independently represents an alkylene group having 1 to 12 carbon atoms; $R^4$ represents a hydrogen atom or a substituted or unsubstituted alkyl group having 1 to 12 carbon atoms, cycloalkyl group, aryl group, aralkyl group or heterocyclic group wherein the substituent on the group of $R^4$ is selected from the group consisting of alkyl or alkoxy group having 1 to 6 carbon atoms and n is a number ranging from 1 to 50).

Among the compounds represented by Formula (I) or (II), particularly preferably used in the present invention are those represented by Formula (I) or (II) wherein $R^2$ and $R^3$ each independently represents an alkylene group having 2 to 6 carbon atoms such as —$CH_2CH_2$—, —$CH_2CH_2CH_2$—, —$(CH_2)_4$—, —$(CH_2)_5$—, —$(CH_2)_6$— or —$CH(CH_3)CH(CH_3)$—, $R^4$ represents a hydrogen atom or a substituted or unsubstituted alkyl group having 1 to 6 carbon atoms and particularly preferably a hydrogen atom or a tetrahydrofurfuryl group and n represents the number of polyester units and ranges from 1 to 50 and preferably 2 to 10.

All of the foregoing polyester chains may be derived from the same ester unit or may comprise at least two different ester units linked together randomly or in block-like arrangement.

Specific compounds include, for instance, caprolactone-acrylate (ToneM-100 available from UCC Company), caprolactone-modified 2-hydroxyethyl acrylate (Plukcel FA Series available from Daicel Chemical Industries, Ltd.), caprolactone-modified 2-hydroxyethyl methacrylate (Plukcel FM Series available from Daicel Chemical Industries, Ltd.) and caprolactone-modified tetrafurfuryl acrylate (KAYARAD TC Series available from Nippon Kayaku Co., Ltd.).

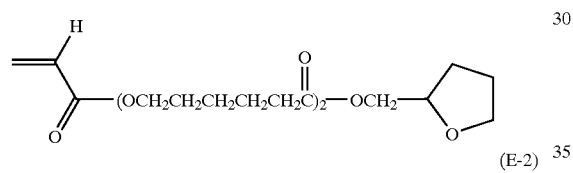
(E-1)

(E-2)

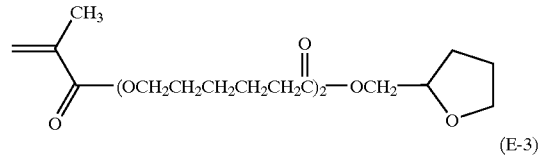
(E-3)

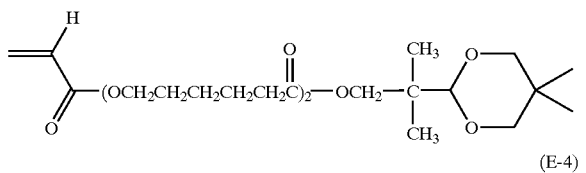
(E-4)

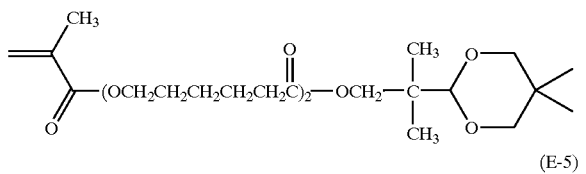
(E-5)

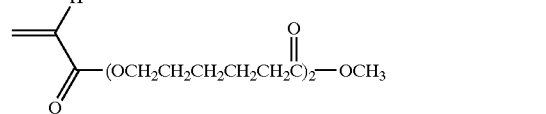
(E-6)

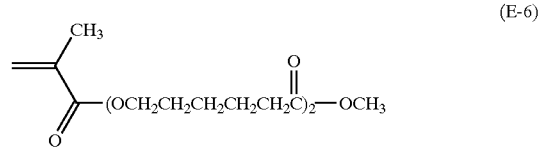

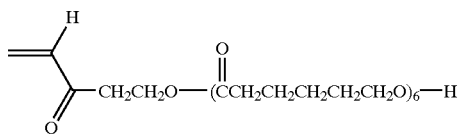
(E-7)

(E-8)

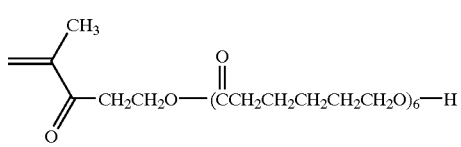
(E-9)

(E-10)

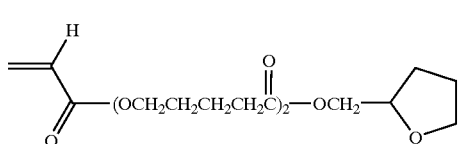

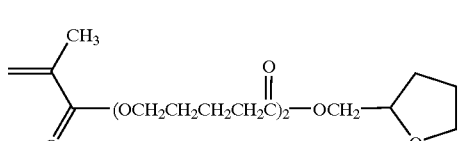
(E-11)

(E-12)

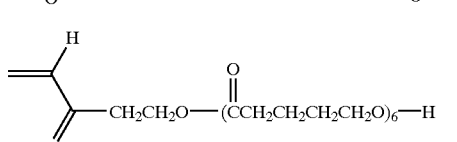

In the present invention, the fluoro-aliphatic group-containing copolymer may be prepared by copolymerizing (A) an addition polymerizable monomer having, on a side chain, a fluoro-aliphatic group in which hydrogen atoms are replaced with fluorine atoms and (B) a (meth)acrylate having an ester chain represented by the foregoing general formula (I) or (II), as essential components, as well as other monomers copolymerizable with the foregoing essential components.

The rate of the other monomers to be copolymerized is not more than 30 mole % and more preferably not more than 20 mole % on the basis of the total molar amount of the monomers.

Such other monomers usable herein may be those disclosed in Polymer Handbook, $2^{nd}$ ed., J. Brandrup, Wiley Interscience (1975), Chapter 2, pp. 1–483.

Specific examples thereof are compounds each having at least one addition polymerizable unsaturated bond selected from the group consisting of acrylic acid, methacrylic acid, acrylic acid esters, methacrylic acid esters, acrylamides, methacrylamides, allyl compounds, vinyl ethers and vinyl esters.

Specific examples of such monomers include those listed below:

Acrylic acid esters such as methyl acrylate, ethyl acrylate, propyl acrylate, chloroethyl acrylate, 2-hydroxyethyl acrylate, trimethylolpropane monoacrylate, benzyl acrylate, methoxybenzyl acrylate, furfuryl acrylate and tetrahydrofurfuryl acrylate;

Methacrylic acid esters such as methyl methacrylate, ethyl methacrylate, propyl methacrylate, chloroethyl methacrylate, 2-hydroxyethyl methacrylate, trimethylolpropane monomethacrylate, benzyl methacrylate, methoxybenzyl methacrylate, furfuryl methacrylate and tetrahydrofurfuryl methacrylate;

Acrylic acid amides such as acrylamide, N-alkyl-acrylamide (the alkyl group may be those having 1 to 3 carbon atoms such as methyl, ethyl or propyl group), N,N-dialkyl-acrylamide (the alkyl group may be those having 1 to 3 carbon atoms), N-hydroxyethyl-N-methylacrylamide and N-2-acetamideethyl-N-acetylacrylamide;

Methacrylamides such as mathacrylamide, N-alkyl-methacrylamide (the alkyl group may be those having 1 to 3 carbon atoms such as methyl, ethyl or propyl group), N,N-dialkyl-methacrylamide (the alkyl group may be those having 1 to 3 carbon atoms), N-hydroxyethyl-N-methyl-methacrylamide and N-2-acetamideethyl-N-acetylmethacryl-amide;

Allyl compounds such as allyl esters (for instance, allyl acetate, allyl caproate, allyl caprylate, allyl laurate, allyl palmitate, allyl stearate, allyl benzoate, allyl acetoacetate and allyl lactate) and allyl oxyethanol;

Vinyl ethers such as alkyl vinyl ethers (for instance, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethyl-aminoethyl vinyl ether, diethyl-aminoethyl vinyl ether, butyl-aminoethyl vinyl ether, benzyl vinyl ether and tetrahydrofurfuryl vinyl ether;

Vinyl esters such as vinyl butyrate, vinyl isobutyrate, vinyl trimethyl-acetate, vinyl diethyl-acetate, vinyl valerate, vinyl caproate, vinyl chloroacetate, vinyl dichloro-acetate, vinyl methoxy-acetate, vinyl butoxy-acetate, vinyl lactate, vinyl-β-phenyl butyrate and vinyl cyclohexyl-carboxylate;

Dialkyl itaconates such as dimethyl itaconates, diethyl itaconates and dibutyl itaconates;

Dialkyl-esters or monoalkyl-esters of fumaric acid such as dibutyl fumarate; and Other monomers such as crotonic acid, itaconic acid, acrylonitrile, methacrylonitrile, maleylonitrile and styrene.

The amount of the fluoro-aliphatic group-containing monomer (A) used for preparing the fluorine atom-containing polymer employed in the present invention is not less than 5% by weight, preferably 5 to 90% by weight, more preferably 5 to 70% by weight and further preferably 7 to 60% by weight on the basis of the total weight of the monomers constituting the fluorine atom-containing polymer.

On the other hand, the amount of the (meth)acrylate monomer carrying an ester chain (B) is not less than 10% by weight, preferably 10 to 95% by weight, more preferably 15 to 70% by weight and further preferably 20 to 60% by weight on the basis of the total weight of the monomers constituting the fluorine atom-containing polymer.

The preferred weight average molecular weight of the fluorine atom-containing polymer used in the present invention ranges from 3,000 to 200,000 and more preferably 6,000 to 80,000.

Moreover, the preferred added amount of the fluorine atom-containing polymer used in the present invention ranges from 0.005 to 8% by weight, preferably 0.01 to 5% by weight and more preferably 0.05 to 3% by weight on the basis of the amount of the light-sensitive resin composition for forming the light-sensitive layer (or the coating components other than the solvent used). This is because if the amount of the polymer is less than 0.005% by weight, the effect achieved by the addition of the polymer is insufficient, while if it exceeds 8% by weight, it is sometimes difficult to completely dry the coated film and the quality (such as sensitivity) of the resulting light-sensitive material is adversely affected.

The fluorine atom-containing polymer used in the present invention may be prepared by any known and commonly used method. For instance, the polymer may be prepared by polymerizing monomers such as the foregoing fluoro-aliphatic group-containing (meth)acrylate and the (meth)acrylate monomer carrying an ester chain in an organic solvent in the presence of a currently used radical polymerization initiator. Alternatively, the polymer may likewise be prepared from the foregoing monomers and other addition polymerizable unsaturated compounds using the same method used above. The use of, for instance, the dropping polymerization method, in which monomers and an initiator are dropwise added to a reaction container, depending on the polymerization ability of every monomers used, is also effective to prepare a polymer having a uniform composition.

Moreover, polymers having a high content of fluorine atom are removed by, for instance, filtration through a column, purification through re-precipitation and/or solvent extraction to thus prevent the occurrence of any repulsive defect.

Specific examples of the fluorine atom-containing polymer used in the present invention will be listed in the following Table, but the present invention is not restricted to these specific examples at all. In the following Table 1, each numerical value represents the rate (by weight) of each monomer component and the abbreviations "Fluoro-Monomer", "Ester Chain-Monomer", "Other Monomer" and "Mw" represent fluoro-aliphatic group-containing monomer (A), ester chain-containing (meth)acrylate monomer (B), other copolymerizable component and weight average molecular weight, respectively.

TABLE 1

| No. | Fluoro-Monomer | | Ester Monomer Chain- | | Other Monomer | | Mw |
|---|---|---|---|---|---|---|---|
| P-1 | F-1 | 40 | E-1 | 60 | — | — | 40000 |
| P-2 | F-1 | 40 | E-3 | 60 | — | — | 30000 |
| P-3 | F-1 | 30 | E-7 | 70 | — | — | 50000 |
| P-4 | F-5 | 50 | E-2 | 50 | — | — | 25000 |
| P-5 | F-5 | 60 | E-7 | 40 | — | — | 15000 |
| P-6 | F-5 | 35 | E-11 | 65 | — | — | 55000 |
| P-7 | F-9 | 40 | E-1 | 60 | — | — | 60000 |
| P-8 | F-9 | 55 | E-3 | 45 | — | — | 85000 |
| P-9 | F-9 | 40 | E-7 | 60 | — | — | 40000 |
| P-10 | F-9 | 50 | E-7 | 40 | NIPAM | 10 | 80000 |
| P-11 | F-9 | 55 | E-8 | 40 | MMA | 5 | 45000 |
| P-12 | F-9 | 40 | E-9 | 60 | — | — | 35000 |
| P-13 | F-10 | 45 | E-2 | 55 | — | — | 15000 |
| P-14 | F-10 | 50 | E-8 | 50 | — | — | 55000 |
| P-15 | F-17 | 40 | E-1 | 60 | — | — | 60000 |
| P-16 | F-17 | 50 | E-7 | 50 | — | — | 20000 |
| P-17 | F-17 | 40 | E-10 | 60 | — | — | 30000 |
| P-18 | F-17 | 50 | E-1 | 40 | HEMA | 10 | 15000 |
| P-19 | F-17 | 50 | E-6 | 45 | Aam | 5 | 40000 |
| P-20 | F-18 | 50 | E-4 | 50 | — | — | 60000 |
| P-21 | F-18 | 45 | E-8 | 55 | — | — | 15000 |
| P-22 | F-38 | 50 | E-6 | 50 | — | — | 20000 |
| P-23 | F-38 | 60 | E-7 | 40 | — | — | 40000 |
| P-24 | F-38 | 70 | E-8 | 30 | — | — | 30000 |
| P-25 | F-43 | 40 | E-1 | 60 | — | — | 25000 |
| P-26 | F-43 | 45 | E-7 | 55 | — | — | 20000 |
| P-27 | F-47 | 40 | E-1 | 60 | — | — | 30000 |

TABLE 1-continued

| No. | Fluoro-Monomer | | Ester Monomer | Chain- | Other Monomer | | Mw |
|---|---|---|---|---|---|---|---|
| P-28 | F-47 | 60 | E-3 | 40 | — | — | 40000 |
| P-29 | F-47 | 50 | E-7 | 50 | — | — | 25000 |
| P-30 | F-47 | 45 | E-7 | 50 | HEMA | 5 | 15000 |

NIPAM: N-isopropyl-acrylamide;
MMA: methyl methacrylate;
HEMA: 2-hydroxyethyl methacrylate;
Aam: acrylamide.

Then other components required for the preparation of the light-sensitive resin composition as a composition for forming the light-sensitive layer in the present invention will hereunder be described in detail.

In the present invention, the light-sensitive resin composition for forming the foregoing fluorine polymer-containing light-sensitive layer comprises at least a light-sensitive compound or a light-heat conversion agent in addition to the foregoing fluorine atom-containing polymer.

A positive type light-sensitive resin composition may be any one containing a light-sensitive compound whose solubility or an ability of swelling undergoes a change before and after the exposure to light, but preferred such light-sensitive compounds are o-quinonediazide compounds. For instance, in case of a positive light-sensitive resin composition containing an alkali-soluble resin and an o-quinonediazide compound, such an o-quinonediazide compound is a compound having at least one o-quinonediazido group and preferably such a compound whose solubility in an alkaline aqueous solution increases after the exposure thereof to actinic light rays.

As such light-sensitive compounds, there have been known those having a variety of structures and the details thereof are disclosed in, for instance, J. KOSAR, "Light-Sensitive Systems", 1965, pp. 336–352, John Wiley & Sons Inc. In particular, compounds preferably used as light-sensitive compounds for the positive light-sensitive resin composition are, for instance, combinations of a variety of hydroxyl compounds with sulfonic acid esters of o-benzoquinone-diazide or o-naphthoquinone-diazide.

Examples of such o-quinonediazide compounds are, for instance, esters of 1,2-naphthoquinone-2-diazide-5-sulfonyl chloride with phenol-formaldehyde resins or cresol-formaldehyde resins; esters of 1,2-naphthoquinone-2-diazide-5-sulfonyl chloride with pyrogallol-acetone resins as disclosed in U.S. Pat. No. 3,635,709; esters of 1,2-naphthoquinone-2-diazide-5-sulfonyl chloride with resorcin-benzaldehyde resins as disclosed in Japanese Examined Patent Publication (hereunder referred to as "J.P. KOKOKU") No. Sho 63-13528; esters of 1,2-naphthoquinone-2-diazide-5-sulfonyl chloride with resorcin-pyrogallol-acetone copolycondensed resins as disclosed in J.P. KOKOKU No. Sho 62-44257; products obtained by esterification of polyesters having terminal hydroxyl groups with 1,2-naphthoquinone-2-diazide-5-sulfonyl chloride as disclosed in J.P. KOKOKU No. Sho 56-45127; products obtained by esterification of homopolymers of N-(4-hydroxyphenyl) methacrylamide or copolymers of the monomer and other copolymerizable monomers with 1,2-naphthoquinone-2-diazide-5-sulfonyl chloride as disclosed in J.P. KOKOKU No. Sho 50-24641; esters of 1,2-naphthoquinone-2-diazide-5-sulfonyl chloride with bisphenol-formaldehyde resins as disclosed in J.P. KOKOKU No. Sho 54-29922; products obtained by esterification of homopolymers of p-hydroxystyrene or copolymers of the monomer and other copolymerizable monomers with 1,2-naphthoquinone-2-diazide-5-sulfonyl chloride as disclosed in J.P. KOKOKU No. Sho 52-36043; and esters of 1,2-naphthoquinone-2-diazide-5-sulfonyl chloride with polyhydroxy-benzophenone.

Examples of other known o-quinonediazide compounds usable in the present invention are those disclosed in, for instance, J.P. KOKAI Nos. Sho 63-80254, Sho 58-5737, Sho 57-111530, Sho 57-111531, Sho 57-114138, Sho 57-142635 and Sho 51-36129; J.P. KOKOKU Nos. Sho 63-3411, Sho 62-51459 and Sho 51-483. The content of the foregoing o-quinonediazide compound in the light-sensitive resin composition in general ranges from 5 to 60% by weight and more preferably 10 to 40% by weight on the basis of the total solid content of the composition.

Light-sensitive compounds used herein other than the o-quinonediazide type ones are chemical sensitizer type light-sensitive materials comprising combinations of compounds whose alkaline-soluble groups are protected with groups susceptible to acid-decomposition with photolytically acid-generating agents. The photolytically acid-generating agents used in the chemical sensitizer system may be any known one.

Specific examples thereof include diazonium salts disclosed in, for instance, S. I. Schlesinger, Photogr. Sci. Eng., 1974, 18:387 and T. S. Bal et al., Polymer, 1980, 21:423; ammonium salts disclosed in, for instance, U.S. Pat. Nos. 4,069,055 and 4,069,056 and J. P. KOKAI No. Hei 3-140140; phosphonium salts disclosed in, for instance, D.C. Necker et al., Macromolecules, 1984, 17:2468, C. S. Wen et al., Tech. Proc. Conf. Rad. Curing ASIA, p. 478, Tokyo, October (1988) and U.S. Pat. Nos. 4,069,055 and 4,069,056; iodonium salts disclosed in, for instance, J. V. Crivello et al., Macromolecules, 10 (6), 1307 (1977), Chem. Eng. News, Nov. 28, p. 31 (1988), European Patent No. 104,143, U.S. Pat. Nos. 339,049 and 410,201 and J. P. KOKAI Nos. Hei 2-150848 and Hei 2-296514; sulfonium salts disclosed in, for instance, J. V. Crivello et al., Polymer J., 1985, 17:73, J. V. Crivello et al., J. Org. Chem., 1978, 43:3055, W. R. Watt et al., J. Polymer Sci., Polymer Chem. Ed., 1984, 22:1789, J. V. Crivello et al., Polymer Bull., 1985, 14:279, J. V. Crivello et al., Macromolecules, 14(5), 1141 81981), J. V. Crivello et al., J. Polymer Sci., Polymer Chem. Ed., 1979, 17:2877, European Patent Nos. 370,693, 233,567, 297,443 and 297,442, U.S. Pat. Nos. 3,902,114, 4,933,377, 410,201, 339,049, 4,760,013, 4,734,444 and 2,833,827 and German Patent Nos. 2,904,626, 3,604,580 and 3,604,581; selenonium salts disclosed in, for instance, J. V. Crivello et al., Macromolecules, 10(6), 1307 (1977) and J. V. Crivello et al., J. Polymer Sci., Polymer Chem. Ed., 1979, 17:1047; onium salts such as arsonium salts disclosed in, for instance, C. S. Wen et al., Tech. Proc. Conf. Rad. Curing ASIA, p. 478, Tokyo, October (1988); organic halogen-containing compounds disclosed in, for instance, U.S. Pat. No. 3,905, 815, J.P. KOKOKU No. Sho 46-4605, J.P. KOKAI Nos. Sho 48-36281, Sho 55-32070, Sho 60-239736, Sho 61-169835, Sho 61-169837, Sho 62-58241, Sho 62-212401, Sho 63-70243 and Sho 63-298339; organometal/organic halogen-containing compounds disclosed in, for instance, K. Meier et al., J. Rad. Curing, 13(4), 26 (1986), T. P. Gill et al., Inorg. Chem., 1980, 19:3007, D. Astruc, Acc. Chem. Res., 19(12), 377 (1896) and J.P. KOKAI No. Hei 2-161445; photolytically acid-generating agents disclosed in, for instance, S. Hayase et al., J. Polymer Sci., 1987, 25:753, E. Reichmanis et al., J. Polymer Sci., Polymer Chem. Ed., 1985, 23:1, Q. Q. Zhu et al., J. Photochem., 36, 85, 39, 317 (1987), B. Amit et al., Tetrahedron Lett., (24), 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11(4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130(6), F. M. Houlihan et al., Macromolecules, 21, 2001 (1988), European Patent Nos. 0,290,750, 046,083, 156,535, 271,851 and 0,388,343, U.S. Pat. Nos. 3,901,710 and 4,181,531 and J. P. KOKAI Nos. Sho 60-198538 and Sho 53-133022; compounds photolytically decomposed into sulfonic acid such as imino-sulfonates such as those disclosed in, for instance, M. Tunooka et al., Polymer Preprints Japan, 35(8), G. Berner et al., J. Rad. Curing, 13(4), W. J. Mijs et al., Coating Technol., 55(697), 45 (1983), Akzo, H. Adachi et al., Polymer Preprints Japan, 37(3), European Patent Nos. 0,199,672, 84,515, 199,672, 044,115 and 0,101, 122, U.S. Pat. Nos. 4,618,564, 4,371,605 and 4,431,774, J.P. KOKAI Nos. Sho 64-18143 and Hei 2-24575 and Japanese Patent Application Serial No. Hei 3-140109; and disulfone compounds disclosed in, for instance, J.P. KOKAI No. Sho 61-166544.

The added amount of these compounds, which are decomposed by the irradiation with actinic light rays or radiant rays to thus generate acids in general ranges from 0.001 to 40% by weight, preferably 0.01 to 20% by weight and more preferably 0.1 to 5% by weight on the basis of the total weight of the light-sensitive resin composition (except for the coating solvent).

Examples of the compounds whose alkaline-soluble groups are protected with groups susceptible to acid-decomposition may be those containing —C—O—C— or —C—O—Si— bonds and specific examples thereof are those listed below:

(a) Compounds containing at least one member selected from the group consisting of ortho-carboxylic acid esters and carboxylic acid amide acetals, these compounds being polymerizable and the foregoing member being able to serve as crosslinking elements in the main chain or as side chains or substituents;

(b) Oligomer-like or polymeric compounds containing, in the main chain, members selected from the group consisting of repeated acetals and ketals;

(c) Compounds containing at least one member selected from the group consisting of enol esters or N-acylaminocarbonates;

(d) Cyclic acetals or ketals of β-ketoesters or β-ketoamides;

(e) Compounds containing silyl ether groups;

(f) Compounds containing silyl enol ether groups;

(g) Monoacetals or monoketals whose aldehyde or ketone component has a solubility, in a developer, ranging from 0.1 to 100 g/l;

(h) Ethers of tertiary alcohols; and (i) Carboxylic acid esters and carbonate esters of tertiary allyl- or benzyl-alcohols.

The foregoing compounds belonging to the foregoing group (a), which are cleavable by the action of an acid are disclosed in German Patent Laid-Open Nos. 2,610,842 and 2,928,636. The mixtures containing the compounds of Group (b) are disclosed in German Patent Nos. 2,306,248 and 2,718,254. The compounds of Group (c) are disclosed in European Patent Laid-Open Nos. 0,006,626 and 0,006,627. The compounds of Group (d) are disclosed in European Patent Laid-Open No. 0,202,196 and the compounds of Group (e) are disclosed in German Patent Laid-Open Nos. 3,544,165 and 3,601,264. The compounds of Group (f) are disclosed in German Patent Laid-Open Nos. 3,730,785 and 3,730,783 and the compounds of Group (g) are disclosed in German Patent Laid-Open No. 3,730,783. The compounds of Group (h) are disclosed in, for instance, U.S. Pat. No. 4,603,101 and the compounds of Group (i) are disclosed in, for instance, U.S. Pat. No. 4,491,628 and the article of J. M. Frechet et al. (J. Imaging Sci., 1986, 30:59–64.

The content of these compounds whose alkaline-soluble groups are protected with groups susceptible to acid-decomposition in the light-sensitive resin composition in general ranges from 1 to 60% by weight and more preferably 5 to 40% by weight on the basis of the total solid content of the resin composition.

The light-sensitive resin composition used in the invention may further comprise a water-insoluble and alkaline aqueous solution-soluble synthetic resin (hereunder referred to as "alkaline-soluble resin").

Examples of such alkaline-soluble resins are phenol-formaldehyde resins, cresol-formaldehyde resins, phenol-cresol-formaldehyde co-polycondensed resins, phenol-modified xylene resins, polyhydroxy-styrene, poly (halogenated hydroxystyrene), copolymers of N-(4-hydroxyphenyl)methacrylamide and copolymers of hydroquinone monomethacrylate, as well as sulfonylamide-containing polymers as disclosed in J.P. KOKAI No. Hei 7-28244 and carboxyl group-containing polymers as disclosed in J.P. KOKAI No. Hei 7-36184. The alkaline-soluble resins also usable herein include a variety of alkaline-soluble high molecular weight compounds such as phenolic hydroxyl group-containing acrylic resins as disclosed in J.P. KOKAI No. Sho 51-34711, sulfonamide group-containing acrylic resins as disclosed in J.P. KOKAI No. Hei 2-866, and urethane-type resins. These alkaline-soluble resins or high molecular weight compounds are preferably those each having a weight average molecular weight ranging from 500 to 20,000 and a number average molecular weight ranging from 200 to 60,000. Such alkaline-soluble resins or high molecular weight compounds may be used alone or in any combination of at least two of them and the amount thereof added to the light-sensitive composition is not more than 80% by weight on the basis of the total solid content of the composition.

Moreover, as disclosed in U.S. Pat. No. 4,123,279, it is preferred for the improvement of the ink receptivity of images to use a condensate of formaldehyde with a phenol carrying an alkyl group having 3 to 8 carbon atoms as a substituent, such as t-butylphenol-formaldehyde resin or octylphenol-formaldehyde resin simultaneously with the foregoing alkaline-soluble resin. Such an alkaline-soluble resin is in general used in an amount of not more than 90% by weight on the basis of the total solid content of the light-sensitive composition.

The light-sensitive resin composition may, if necessary, further comprise, for instance, a cyclic acid anhydride for the improvement of the sensitivity of the composition, an agent or composition for obtaining a visible image immediately after the imagewise exposure thereof, a dye as an image-coloring agent and other fillers.

The light-sensitive resin composition used in the present invention preferably comprises cyclic acid anhydrides, phenols and/or organic acids in order to improve the sensitivity of the resin composition. Examples of such cyclic acid anhydrides are phthalic acid anhydride, tetrahydro-phthalic acid anhydride, hexahydrophthalic acid anhydride, 3,6-endoxy-Δ4-tetrahydro-phthalic acid anhydride, tetrachlorophthalic acid anhydride, maleic acid anhydride, chloromaleic acid anhydride, α-phenyl-maleic acid anhydride, succinic acid anhydride and pyromellitic acid anhydride. Examples of such phenols are bisphenol A, p-nitrophenol, p-ethoxyphenol, 2,3,4-trihydroxy-benzophenone, 4-hydroxy-benzophenone, 2,4,4'-trihydroxy-benzophenone, 4,4',4"-tri-hydroxy-triphenylmethane and 4,4',3",4"-tetrahydroxy-3,5,3',5'-tetramethyl-triphenyl-methane.

Examples of the foregoing organic acids are those disclosed in, for instance, J.P. KOKAI Nos. Sho 60-88942 and Hei 2-96755 such as sulfonic acids, sulfinic acids, alkylsulfates, phosphonic acids, phosphinic acids, phosphoric acid esters and carboxylic acids and more specifically include p-toluene-sulfonic acid, dodecylbenzene-sulfonic acid, p-toluene-sulfinic acid, ethyl sulfate, phenyl-phosphonic acid, phenyl-phosphinic acid, phenyl phosphate, diphenyl phosphate, benzoic acid, isophthalic acid, adipic acid, p-toluic acid, 3,4-dimethoxy benzoate, phthalic acid, terephthalic acid, 1,4-cyclohexene-2,2-dicarboxylic acid, erucic acid, lauric acid, n-undecanoic acid and ascorbic acid.

The content of the foregoing cyclic acid anhydrides, phenols and organic acids in the light-sensitive resin composition preferably ranges from 0.05 to 15% by weight and more preferably 0.1 to 5% by weight.

The agent or composition for obtaining a visible image immediately after the imagewise exposure may be, for instance, combinations of light-sensitive compounds, which can release acids upon irradiation with light and organic dyes which change their color tones through the coupling with acids.

Examples of agents or compositions for obtaining a visible image immediately after the imagewise exposure are o-naphthoquinonediazide-4-sulfonic acid halogenide as disclosed in J.P. KOKAI No. Sho 50-36209; trihalomethyl-2-pyrone and trihalomethyl-s-triazine disclosed in J.P. KOKAI No. Sho 53-36223; a variety of o-naphthoquinonediazide compounds disclosed in J.P. KOKAI No. Sho 55-62444; 2-trihalomethyl-5-aryl-1,3,4-oxadiazole compound disclosed in J.P. KOKAI No. Sho 55-77742; and diazonium salts. These compounds may be used alone or in combination and the added amount thereof preferably ranges from 0.3 to 15% by weight on the basis of the total solid content of the light-sensitive resin composition.

The light-sensitive resin composition used in the present invention comprises at least one organic dye, which changes its color tone through the interaction with the photolytically generated product of a compound capable of generating an acidic substance through the photolytic decomposition. Such organic dyes usable herein are diphenyl methane type, triaryl methane type, thiazine type, oxazine type, phenazine type, xanthene type, anthraquinone type, imino-naphthoquinone type and azomethine type dyes. Specific examples thereof are those listed below:

Brilliant Green, Eosine, Ethyl Violet, Erythrosine B, Methyl Green, Crystal Violet, Basic Fuchsine, Phenolphthalein, 1,3-diphenyl triazine, Alizarin Red S, Thymolphthalein, Methyl Violet 2B, Quinaldine Red, Rose Bengale, Thymolsulfo-phthalein, Xylenol Blue, Methyl Orange, Orange IV, Diphenyl Thiocarbazone, 2,7-dichlorofluorescein, para-Methyl Red, Congo Red, Benzopurpurine 4B, α-Naphthyl Red, Nile Blue 2B, Nile Blue A, Phenacetaline, Methyl Violet, Malachite Green, para-Fuchsine, Oil Blue #603 (available from ORIENT Chemical Industries, Ltd.), Oil Pink #312 (available from ORIENT Chemical Industries, Ltd.), Oil Red 5B (available from ORIENT Chemical Industries, Ltd.), Oil Scarlet #308 (available from ORIENT Chemical Industries, Ltd.), Oil Red OG (available from ORIENT Chemical Industries, Ltd.), Oil Red RR (available from ORIENT Chemical Industries, Ltd.), Oil Green #502 (available from ORIENT Chemical Industries, Ltd.), Spiron Red BEH Special (available from Hodogaya Chemical Co., Ltd.), Victoria Pure Blue BOH (available from Hodogaya Chemical Co., Ltd.), Patent Pure Blue (available from Sumitomo Mikuni Chemical Industries, Ltd.), Sudan Blue II (available from BASF Company), m-Cresol Purple, Cresol Red, Rhodamine B, Rhodamine 6G, Fast Acid Violet R, Sulfo-rhodamine B, Auramine, 4-p-diethylaminophenyl imino-naphthoquinone, 2-carboxyanilino-4-p-diethylaminophenyl imino-naphthoquinone, 2-carbostearylamino-4-p-dihydrooxyethyl-amino-phenyl imino-naphthoquinone, p-methoxybenzoyl-p'-diethylamino-o'-methylphenyl imino-acetanilide, cyano-p-diethylaminophenyl imino-acetanilide, 1-phenyl-3-methyl-4-p-diethylaminophenylimino-5-pyrazolone and 1-β-naphthyl-4-p-diethylaminophenylimino-5-pyrazolone.

Particularly preferred organic dyes are triaryl-methane type dyes. Among these triaryl-methane type dyes, particularly useful ones are those containing ions derived from sulfonic acid compounds as counter anions, as disclosed in, for instance, J.P. KOKAI No. Sho 62-2932471 and Japanese Patent Application Serial No. Hei 4-112844. These dyes may be used alone or in any combination and the added amount thereof preferably ranges from 0.3 to 15% by weight on the basis of the total weight of the light-sensitive resin composition. Moreover, these dyes may, if necessary, be used in combination with other dyes and/or pigments and the amount thereof used is not more than 70% by weight and more preferably not more than 50% by weight on the basis of the total weight of the dyes and pigments.

The light-sensitive resin composition of the present invention can be used in the light-sensitive layer of a photopolymerizable printing plate as a negative printing plate. Such a light-sensitive resin composition will hereunder be described in detail. The principal components of the light-sensitive resin composition of the present invention, which is a photopolymerizable light-sensitive resin composition are, for instance, a compound containing an addition polymerizable ethylenically unsaturated double bond and a photopolymerization initiator, in addition to the foregoing fluorine atom-containing polymer and compounds such as a heat-polymerization inhibitor are, if necessary, added to the resin composition.

The compound containing an addition polymerizable double bond may arbitrarily be selected from compounds having at least one, preferably at least two terminal ethylenically unsaturated double bonds. Examples thereof are those having chemical structures such as monomers, prepolymers, i.e., dimmers, trimers and oligomers, or mixtures or copolymers thereof. Examples of such monomers and copolymers thereof are esters of unsaturated carboxylic acids (such as acrylic acid, methacrylic acid, itaconic acid, crotonic acid, isocrotonic acid and maleic acid) with aliphatic polyhydric alcohol compounds and amides of unsaturated carboxylic acids with aliphatic polyvalent amine compounds.

Examples of the monomers used in the esters of unsaturated carboxylic acids with aliphatic polyhydric alcohol compounds include acrylic acid esters, methacrylic acid esters, itaconic acid esters and crotonic acid esters. Specific examples of acrylic acid esters are ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxy-propyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomers.

Specific examples of methacrylic acid esters are tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol methacrylate, sorbitol tetramethacrylate, bis-[p-(3-methacryloxy-2-hydroxypropoxy)phenyl]dimethylmethane and bis-[p-(methacryloxy-ethoxy)phenyl]dimethylmethane.

Examples of itaconic acid esters are ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of crotonic acid esters are ethylene glycol dicrotonate, tetramethylene glycol dicrotonate, pentaerythritol dicrotonate and sorbitol tetracrotonate. Examples of isocrotonic acid esters are ethylene glycol diisocrotonate, pentaerythritol diisocrotonate and sorbitol tetraisocrotonate. Examples of maleic acid esters include ethylene glycol dimaleate, triethylene glycol dimaleate, pentaerythritol dimaleate and sorbitol tetramaleate. Moreover, mixtures of the foregoing ester monomers may likewise be used.

Moreover, specific examples of amide monomers of unsaturated carboxylic acids with aliphatic polyvalent amine compounds include methylene-bis-acryalmide, methylene-bis-methacrylamide, 1,6-hexamethylene-bis-acrylamide, 1,6-hexamethylene-bis-methacrylamide, diethylenetriamine-trisacrylamide, xylylene-bis-acrylamide and xylylene-bis-methacrylamide. Examples thereof further include vinyl urethane compounds having, in the molecule, at least two polymerizable vinyl groups, obtained by adding hydroxyl group-containing vinyl monomers represented by the following general formula (i) to polyisocyanate compounds having at least two isocyanate groups in the molecule, such as those disclosed in J.P. KOKOKU No. Sho 48-41708:

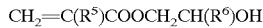    (i)

Wherein $R^5$ and $R^6$ each represents H or a $CH_3$ group.

Examples thereof further include urethane acrylates disclosed in J.P. KOKAI No. Sho 51-37193; polyester acrylates disclosed in J.P. KOKAI No. Sho 48-64183 and J.P. KOKOKU Nos. Sho 49-43191 and Sho 52-30490; and polyfunctional acrylates and methacrylates such as epoxy acrylates obtained through the reactions of epoxy resins with (meth)acrylic acids. Moreover, usable herein also include those introduced as photohardenable monomers and oligomers in Bulletin of Adhesives Association in Japan, 1984, Vol. 20, No. 7, pp. 300–308.

In this respect, the amount of these double bond-containing compounds ranges from 5 to 70% by weight and preferably 10 to 50% by weight.

The photopolymerizable light-sensitive resin composition used in the present invention may comprise, as the photopolymerization initiator, a variety of photopolymerization initiators known in patents and literatures or combined systems (photopolymerization initiator systems) containing at least two photopolymerization initiators, which are appropriately selected depending on the wavelength of the light rays emitted from a light source used. For instance, when using a light source emitting light rays having a wavelength in the proximity to 400 nm, benzyl, benzoin ether, Michler's ketones, anthraquinone, thioxanthone, acridine, phenazine and benzophenone have been widely used.

Moreover, if using visible light rays of not less than 400 nm, an Ar laser, secondary higher harmonic waves of semiconductor lasers, SHG-YAG laser as light sources, there have also been proposed a variety of photopolymerization initiators. Examples thereof include certain kinds of photoreducing dyes disclosed in U.S. Pat. No. 2,850,445 such as Rose Bengale, Eosine and Erythrosine, or systems containing dyes and photopolymerization initiators such as combined initiator systems comprising dyes and amines (J.P. KOKOKU No. Sho 44-20189), combined systems comprising hexaaryl-biimidazole, radical generators and dyes (J.P. KOKOKU No. Sho 45-37377), hexaaryl-biimidazole-p-dialkyl amino-benzylidene ketone systems (J.P. KOKOKU No. Sho 47-2528 and J.P. KOKAI No. Sho 54-155292), systems comprising cyclic cis-α-dicarbonyl compounds and dyes (J.P. KOKAI No. Sho 48-84183), cyclic triazine-merocyanine dye systems (J.P. KOKAI No. Sho 54-151024), 3-ketocumarin-activator systems (J.P. KOKAI Nos. Sho 52-112681 and Sho 58-15503), biimidazole-styrene derivative-thiol systems (J.P. KOKAI No. Sho 59-140203), organic peroxide-dye systems (J.P. KOKAI Nos. Sho 59-1504, Sho 59-140203, Sho 59-189340 and Sho 62-174203, J.P. KOKOKU No. Sho 62-1641 and U.S. Pat. No. 4,766,055), dye-active halogen-containing compound systems (for instance, J.P. KOKAI Nos. Sho 63-258903 and Hei 2-63054), dye-borate compound systems (for instance, J.P. KOKAI Nos. Sho 62-143044, Sho 62-150242, Sho 64-13140, Sho 64-13141, Sho 64-13142, Sho 64-13143, Sho 64-13144, Sho 64-17048, Hei 1-229003, Hei 1-298348 and Hei 1-138204), rhodanine ring-containing dye-radical generator systems (J.P. KOKAI Nos. Hei 2-179643 and Hei 2-244050), systems comprising titanocene and 3-ketocumarin dyes (J.P. KOKAI No. Sho 63-221110), systems comprising combinations of titanocene, Xanthene dyes and addition polymerizable ethylenically unsaturated compounds containing amino or urethane groups (J.P. KOKAI Nos. Hei 4-221958 and Hei 4-219756), systems titanocene and specific merocyanine dyes (J.P. KOKAI No. Hei 6-295061) and titanocene-benzopyran ring-containing dyes (J.P. KOKAI No. Hei 8-334897). The amount of these photopolymerization initiators to be used ranges from 0.05 to 100 parts by weight, preferably 0.1 to 70 parts by weight and more preferably 0.2 to 50 parts by weight per 100 parts by weight of the ethylenically unsaturated compound.

Moreover, in the photopolymerizable light-sensitive resin composition used in the present invention, it is desirable to incorporate, into the resin composition, a small amount of heat polymerization-inhibitory agent for the prevention of any undesirable heat polymerization of the polymerizable ethylenically unsaturated compound during the preparation of the resin composition or during the storage thereof, in addition to the foregoing basic components. Examples of heat polymerization-inhibitory agents suitably used herein are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis (4-methyl-6-t-butylphenol), N-nitrosophenyl-hydroxylamine cerous salt and N-nitrosophenyl-hydroxylamine aluminum salt. The amount of the heat polymerization-inhibitory agent to be added preferably ranges from about 0.01 to about 5% by weight on the basis of the total solid content of the resin composition. Moreover, it is also possible to, if necessary, incorporate, for instance, higher fatty acid derivatives such as behenic acid or behenic acid amide into the resin composition and to allow the derivatives to localize on the surface of the light-sensitive layer during the drying process after the application thereof for the prevention of any polymerization due to oxygen. The amount of the higher fatty acid derivatives preferably ranges from about 0.5 to about 10% by weight on the basis of the total solid content of the resin composition.

The lithographic printing plate whose light-sensitive layer (image-forming layer) is prepared using a photopolymerizable light-sensitive resin composition of the present invention may comprise a protective layer having oxygen barrier properties and formed on the light-sensitive layer, for preventing the occurrence of any polymerization due to oxygen. The protective layer having oxygen barrier properties comprises a water-soluble vinyl polymer and examples of such vinyl polymers include polyvinyl alcohol and partial esters thereof, and copolymers of ethers and acetal, or a substantial amount of unsaturated vinyl alcohol units required for imparting water-solubility to the resulting copolymer. Specific examples of polyvinyl alcohols are those which are hydrolyzed to a rate of 71 to 100% and which have a degree of polymerization ranging from 300 to 2400.

Examples of commercially available water-soluble vinyl polymers include PVA-105, PVA-110, PVA-17, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 available from Kuraray Co., Ltd. Examples of the foregoing copolymers are polyvinyl acetate chloroacetate or propionate, which is hydrolyzed to a rate ranging from 88 to 100%, polyvinyl formal and polyvinyl acetal as well as copolymers thereof. Examples of other useful polymers are polyvinyl pyrrolidone, gelatin and gum arabic, which may be used alone or in any combination.

The solvent used when applying the protective layer having oxygen barrier properties in the present invention is preferably water, but may be a mixture of pure water and an alcohol such as methanol or ethanol, or a ketone such as acetone or methyl ethyl ketone. In this respect, the concentration of solid contents present in the coating solution suitably ranges from 1 to 20% by weight. In the present invention, the protective layer having oxygen barrier properties may further comprise a surfactant for the improvement of the coating properties of the resulting solution and/or a known additive such as a water-soluble plasticizer for the improvement of physical properties of the resulting film. Examples of such water-soluble plasticizers include propionamide, cyclohexane-diol, glycerin and sorbitol. Alternatively, for instance, a water-soluble (meth) acrylic polymer may likewise be incorporated into the coating solution. The coated amount of the protective layer having oxygen barrier properties suitably ranges from about $0.1/m^2$ to about $15/m^2$ and more preferably $1.0/m^2$ to about $5.0/m^2$ as expressed in terms of the weight thereof weighed after drying.

The present invention may likewise be applied to, for instance, lithographic printing plates of the following types, in addition to the presensitized plate for making positive lithographic printing plates (also referred to as "positive PS plates") whose light-sensitive layer comprises the foregoing positive light-sensitive resin composition prepared using a quinonediazide, or a compound having alkaline-soluble groups protected by acid-decomposable groups and negative PS plates, which make use of photopolymerizable systems:

(1) Negative lithographic printing plate materials whose light-sensitive layer comprises a diazo resin;
(2) Negative lithographic printing plate materials whose light-sensitive layer comprises a photo-cross-linkable resin;
(3) Negative laser-direct printing type lithographic printing materials whose light-sensitive layer comprises an alkali-soluble binder, acid-generator and acid (or heat)-cross-linkable compound;
(4) Positive laser-direct printing type lithographic printing materials whose light-sensitive layer comprises a light-heat conversion agent, an alkali-soluble binder and, as an optional component, a heat-decomposable substance, which can substantially reduce the solubility of the binder when it is in the undecomposed state; and
(5) Negative laser-direct printing type lithographic printing materials whose light-sensitive layer comprises a light-heat conversion agent, a thermally radical-generating agent and a radical polymerizable compound.

Components used in each lithographic printing plate material will in order be detailed below.

The diazo resins used in the material (1) include, for instance, those represented by salts of condensates of diazo-diarylamine with active carbonyl compounds and preferred are those, which are light-sensitive, water-insoluble and organic solvent-soluble.

Examples of diazo resins particularly suitably used herein are organic acid salts or inorganic acid salts of condensates of, for instance, 4-diazo-diphenylamine, 4-diazo-3-methyl-diphenylamine, 4-diazo-4'-methyldiphenylamine, 4-diazo-3'-methyldiphenyl-amine, 4-diazo-4'-methoxydiphenylamine, 4-diazo-3-methyl-4'-ethoxydiphenylamine or 4-diazo-3-methoxydiphenylamine with, for instance, formaldehyde, para-formaldehyde, acetaldehyde, benzaldehyde or 4,4'-bis-methoxymethyl-diphenyl ether.

Examples of organic acids used for preparing such organic acid salts are methanesulfonic acid, benzenesulfonic acid, toluenesulfonic acid, xylenesulfonic acid, mesitylene-sulfonic acid, dodecylbenzenesulfonic acid, naphthalene-sulfonic acid, propionaphthalenesulfonic acid, 1-naphthol- 5-sulfonic acid, 2-nitrobenzenesulfonic acid, 3-chlorobenzenesulfonic acid and 2-hydroxy-4-methoxybenzophenone-5-sulfonic acid, and examples of inorganic acids used for preparing the foregoing inorganic acid salts are hexafluoro-phosphoric acid, tetrafluoro-boric acid and thiocyanic acid. The diazo resins also usable in the present invention include, for instance, diazo resins whose principal chain comprises polyester units as disclosed in J.P. KOKAI No. Sho 54-30121; diazo resins obtained through reactions of carboxylic acid anhydride residue-containing polymers with hydroxyl group-containing diazo compounds such as those disclosed in J.P. KOKAI No. Sho 61-273538; and diazo resins obtained through reactions of polyisocyanate compounds with hydroxyl group-containing diazo compounds.

The amount of these diazo resins used preferably ranges from 0 to 40% by weight on the basis of the total solid content of the resin composition and at least two diazo resins may, if necessary, be used in combination. Moreover, when preparing a negative light-sensitive resin composition, an organic high molecular weight binder is in general used in combination. Examples of such organic high molecular weight binders usable herein include acrylic resins, polyamide resins, polyester resins, epoxy resins, polyacetal resins, polystyrene resins and novolak resins. Furthermore, the resin composition used in the present invention may comprise known additives for improving the quality of the resulting film such as heat polymerization-inhibitory agent, a dye, a pigment, a plasticizer and/or a stability-improving agent.

Examples of suitably used dyes are basic oil-soluble dyes such as Crystal Violet, Malachite Green, Victoria Blue, Methylene Blue, Ethyl Violet and Rhodamine B. Examples of commercially available dyes are "Victoria Pure Blue BOH" (available from Hodogaya Chemical Co., Ltd.) and "Oil Blue #603" (available from Orient Chemical Industry Co., Ltd.). Examples of pigments usable herein are Phthalocyanine Blue, Phthalocyanine Green, Dioxazine Violet and Quinacridone Red.

Examples of plasticizers are diethyl phthalate, dibutyl phthalate, dioctyl phthalate, tributyl phosphate, trioctyl phosphate, tricresyl phosphate, tri(2-chloroethyl) phosphate and tributyl citrate. Moreover, examples of known stability-improving agents, which may simultaneously be used in the resin composition, are phosphoric acid, phosphorous acid, oxalic acid, tartaric acid, malic acid, citric acid, dipicolinic acid, polyacrylic acid, benzenesulfonic acid and toluenesulfonic acid. The amount of these various kinds of additives to be added may vary depending on the purposes, but preferably ranges from 0 to 30% by weight on the basis of the total solid content of the light-sensitive resin composition.

The photo-cross-linkable resin used in the material (2) is preferably one having an affinity for an aqueous alkali developer and examples thereof include copolymers containing cinnamic acid residues and carboxyl groups as disclosed in J.P. KOKOKU No. Sho 54-15711; polyester resins containing phenylene diacrylic acid residues and carboxyl groups as disclosed in J.P. KOKAI No. Sho 60-165646; polyester resins containing phenylene diacrylic acid residues and phenolic hydroxyl groups as disclosed in J.P. KOKAI No. Sho 60-203630; polyester resins containing phenylene diacrylic acid residues and sodium iminodisulfonyl groups as disclosed in J.P. KOKOKU No. Sho 57-42858; polymers having, on side chains, azido groups and carboxyl groups as disclosed in J.P. KOKAI No. Sho 59-208552; and polymers having, on side chains, maleimido groups as disclosed in J.P. KOKAI No. Hei 7-295212.

The alkali-soluble binders and acid-generating agents used in the material (3) may be the same as those used in the aforementioned positive PS plate, which makes use of the quinonediazide or the compound having alkali-soluble groups protected with acid-decomposable groups. The term "acid (or heat)-cross-linkable compound" herein used means a compound capable of undergoing crosslinking in the presence of an acid and examples thereof include aromatic and heterocyclic compounds multi-substituted with hydroxymethyl groups, acetoxymethyl groups or alkoxymethyl groups, with compounds obtained by condensing phenols and aldehydes under basic conditions being particularly preferred. Among the foregoing compounds, preferred are, for instance, compounds obtained by condensing phenols with formaldehyde under basic conditions as described above; compounds obtained from m-cresol and formaldehyde, compounds prepared from bisphenol A and formaldehyde and compounds obtained from 4,4'-bisphenol and formaldehyde, according to the same procedures used above; and other compounds such as those disclosed in G.B. Patent No. 2,082,339 as resol resins.

These acid-cross-linkable compounds preferably have a weight average molecular weight ranging from 500 to 100,000 and a number average molecular weight ranging from 200 to 50,000. Examples of other compounds preferably used herein likewise include aromatic compounds replaced with alkoxymethyl or oxiranylmethyl groups disclosed in EP-A-0,212,482; monomers and oligomers such as melamine-formaldehyde condensate and urea-formaldehyde condensate disclosed in EP-A-0,133,216, DE-A-3,634,671 and DE 3,711,264; and alkoxy-substituted compounds disclosed in EP-A-0,212,482. Examples of other preferred compounds include melamine-formaldehyde derivatives carrying at least two free N-hydroxymethyl, N-alkoxymethyl or N-acyloxymethyl groups. Among them, particularly preferred are N-alkoxymethyl derivatives.

In addition, low molecular weight or oligomeric silanols may be used as silicon atom-containing crosslinking agents. Examples thereof are dimethyl- and diphenyl-silane-diol and preliminarily condensed oligomers having units derived from these diols and usable herein include, for instance, those disclosed in EP-A-0,377,155. Among the aromatic and heterocyclic compounds multi-substituted with alkoxymethyl groups, preferred are compounds whose alkoxymethyl groups are present at positions adjacent to hydroxyl groups and in which the alkoxymethyl groups each has not more than 18 carbon atoms, with the compounds represented by the following general formulas (ii) to (v) being particularly preferred:

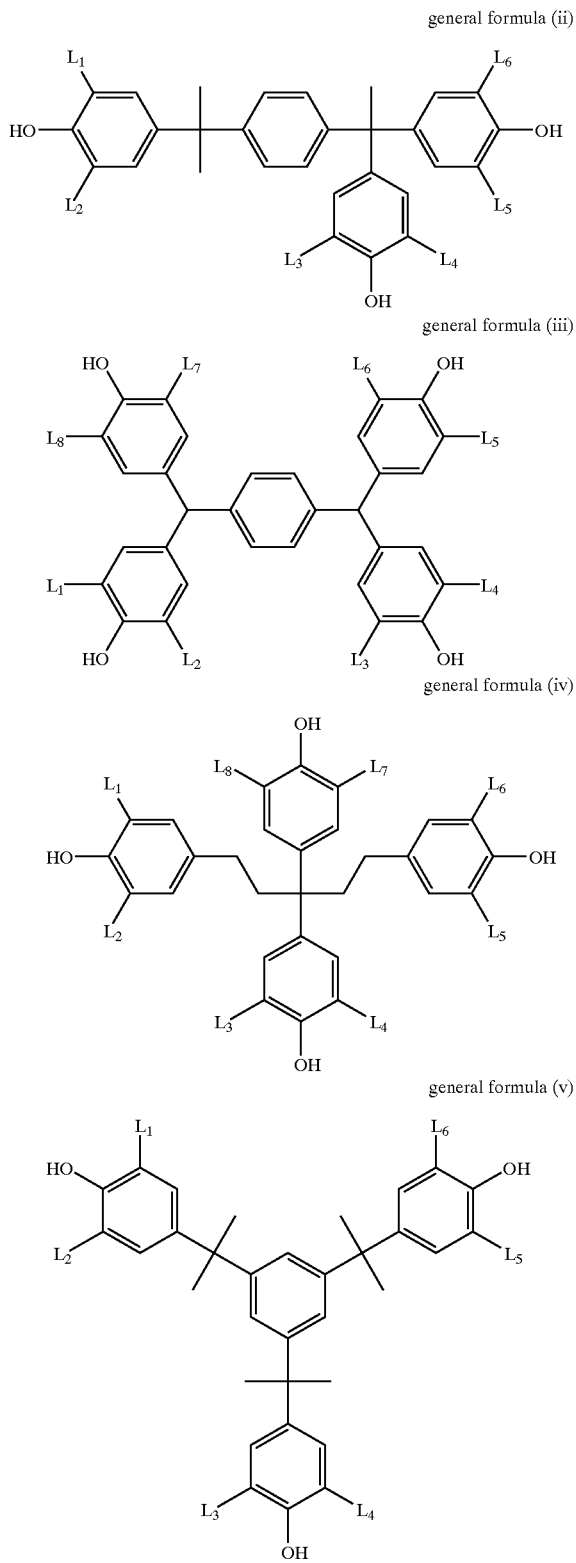

general formula (ii)

general formula (iii)

general formula (iv)

general formula (v)

Wherein $L_1$ to $L_8$ may be the same or different and each represents an alkoxymethyl group substituted with an alkoxy group having not more than 18 carbon atoms such as a methoxymethyl or ethoxymethyl group. These compounds are preferred since they have high crosslinking efficiency and permit the improvement of the printing durability of the resulting printing plate. The foregoing thermally cross-linkable compounds may be used alone or in any combination of at least two of them.

The acid-cross-linkable compound used in the present invention is used in the light-sensitive layer in an amount ranging from 5 to 80% by weight, preferably 10 to 75% by weight and particularly preferably 20 to 70% by weight on the basis of the total solid content of the light-sensitive layer. This is because if the added amount of the acid-cross-linkable compound is less than 5% by weight, the resulting light-sensitive layer of the lithographic printing plate material is insufficient in the durability, while if it exceeds 80% by weight, the stability of the light-sensitive layer during storage is insufficient.

The alkali-soluble binders used in the material (4) may be the same as those used in the aforementioned positive PS plate, which makes use of the aforementioned quinonediazide. The substances, which are heat-decomposable and which can substantially reduce the solubility of the alkali-soluble binder in the undecomposed state, may, for instance, be a variety of onium salts and quinonediazide compounds. These compounds are preferably used in the present invention, since they are excellent in the effect of reducing the solubility of the alkali-soluble binder. Specific examples of such onium salts are diazonium salts, ammonium salts, phosphonium salts, iodonium salts, sulfonium salts, selenonium salts and arsonium salts.

Examples of onium salts preferably used in the present invention include diazonium salts disclosed in, for instance, S. I. Schlesinger, Photogr. Sci. Eng., 1974, 18:387, T. S. Bal et al., Polymer, 1980, 21:423 and J.P. KOKAI No. Hei 5-158230; ammonium salts disclosed in, for instance, U.S. Pat. Nos. 4,069,055 and 4,069,056 and J.P. KOKAI No. Hei 3-140140; phosphonium salts disclosed in, for instance, D.C. Necker et al., Macromolecules, 1984, 17:2468, C. S. Wen et al., Tech. Proc. Conf. Rad. Curing ASIA, 1988 (October), p. 478, Tokyo and U.S. Pat. Nos. 4,069,055 and 4,069,056; iodonium salts disclosed in, for instance, J. V. Crivello et al., Macromolecules, 1977, 10(6): 1307, Chem. & Eng. News, Nov. 28, 1988, p. 31, European Patent No. 104,143, U.S. Pat. Nos. 339,049 and 410,201 and J.P. KOKAI Nos. Hei 2-150848 and Hei 2-296514; sulfonium salts disclosed in, for instance, J. V. Crivello et al., Polymer J., 1985, 17:73, J. V. Crivello et al., J. Org. Chem., 1978, 43:3055, W. R. Watt et al., J. Polymer Sci., Polymer Chem. Ed., 1984, 22:1789, J. V. Crivello et al., Polymer Bull., 1985, 14:279, J. V. Crivello et al., Macromolecules, 1981, 14(5) :1141, J. V. Crivello et al., J. Polymer Sci., Polymer Chem. Ed., 1979, 17:2877, European Patent Nos. 370,693, 233,567, 297,443 and 297,442, U.S. Pat. Nos. 3,902,114, 4,933,377, 410,201, 339,049, 4,760,013, 4,734,444 and 2,833,827 and German Patent Nos. 2,904,626, 3,604,580 and 3,604,581; selenonium salts disclosed in, for instance, J. V. Crivello et al., Macromolecules, 1977, 10(6):1307 and J. V. Crivello et al., J. Polymer Sci., Polymer Chem. Ed., 1979, 17:1047; and arsonium salts disclosed in, for instance, C. S. Wen et al., Tech. Proc. Conf. Rad. Curing ASIA, 1988 (October), p. 478, Tokyo.

Among them, diazonium salts are particularly preferably used in the present invention. Moreover, particularly preferred diazonium salts are those disclosed in J.P. KOKAI No. Hei 5-158230. Examples of quinonediazide compounds preferably used herein are o-quinonediazide compounds.

The o-quinonediazide compound used in the present invention is one having at least one o-quinonediazido group, whose alkali-solubility increases through thermal decomposition and may be those having a variety of structures. More specifically, o-quinonediazide loses its ability of controlling the solubility of the alkali-soluble binder through thermal decomposition, o-quinonediazide as such may be converted into an alkali-soluble substance and these two effects would assist in the improvement of the solubility of the light-sensitive material. The o-quinonediazide compounds usable in the present invention include, for instance, those described in J. Corser, "Light-Sensitive Systems", John Wiley & Sons Inc., pp. 339–352, but particularly preferred are sulfonic acid esters or sulfonic acid amides of o-quinonediazide, which are reacted with a variety of aromatic polyhydroxy compounds or aromatic amino group-containing compounds. Moreover, preferably used herein also include esters of benzoquinone-(1,2)-diazide sulfonic acid chloride or naphthoquinone-(1,2)-diazide-5-sulfonic acid chloride with pyrogallol-acetone resins as disclosed in J.P. KOKOKU No. Sho 43-28403 and esters of benzoquinone-(1,2)-diazide sulfonic acid chloride or naphthoquinone-(1,2)-diazide-5-sulfonic acid chloride with phenol-formaldehyde resins as disclosed in U.S. Pat. Nos. 3,046,120 and 3,188,210.

Furthermore, suitably used herein also include esters of naphthoquinone-(1,2)-diazide-4-sulfonic acid chloride with phenol-formaldehyde resins or cresol-formaldehyde resins and esters of naphthoquinone-(1,2)-diazide-4-sulfonic acid chloride with pyrogallol-acetone resins. Examples of other useful o-quinonediazide compounds have been known and reported in a variety of patent-related articles (patent specifications) and there may be listed, for instance, those disclosed in, for instance, J.P. KOKAI Nos. Sho 47-5303, Sho 48-63802, Sho 48-63803, Sho 48-96575, Sho 49-38701 and Sho 48-13354, J.P. KOKOKU Nos. Sho 41-11222, Sho 45-9610 and Sho 49-17481, U.S. Pat. Nos. 2,797,213, 3,454,400, 3,554,323, 3,573,917, 3,674,495 and 3,785,825, G.B. Patent Nos. 1,277,602, 1,251,345, 1,267,005, 1,329,888 and 1,330,932 and German Patent No. 854,890.

The amount of the o-quinonediazide compound used in the present invention preferably ranges from 1 to 50% by weight, more preferably 5 to 30% by weight and more preferably 10 to 30% by weight on the basis of the total solid content of the lithographic printing plate material. These compounds may be used alone or a mixture containing at least two of these compounds. This is because if the added amount of the o-quinonediazide compound is less than 1% by weight, the image-recording properties of the resulting printing plate material is impaired, while if it exceeds 50% by weight, the durability of the image area is deteriorated and/or the sensitivity of the material is reduced.

Examples of counterions for the onium salts suitably used herein are those derived from tetrafluoro-boric acid, hexafluoro-phosphoric acid, triisopropyl-naphthalene-sulfonic acid, 5-nitro-o-toluene-sulfonic acid, 5-sulfosalicylic acid, 2,5-dimethylbenzene-sulfonic acid, 2,4,6-trimethylbenzene-sulfonic acid, 2-nitrobenzene-sulfonic acid, 3-chlorobenzene-sulfonic acid, 3-bromobenzene-sulfonic acid, 2-fluorocapryl-naphthalene-sulfonic acid, dodecylbenzene-sulfonic acid, 1-naphthol-5-sulfonic acid, 2-methoxy-4-hydroxy-5-benzoyl-benzenesulfonic acid and p-toluene-sulfonic acid. Among these counterions, particularly preferred are those derived from alkyl-aromatic sulfonic acids such as hexafluoro-phosphoric acid, triisopropyl-naphthalene-sulfonic acid and 2,5-dimethylbenzene-sulfonic acid. The added amount of the foregoing additives other than the o-quinonediazide compounds preferably ranges from 1 to 50% by weight, more preferably 5 to 30% by weight and particularly preferably 10 to 30% by weight on the basis of the total solid content of the lithographic printing plate material.

Specific examples of ingredients used in the material (5) may be the same as those listed above in connection with the foregoing photopolymerizable system. Most of the photopolymerization initiators may likewise be useful as thermally radical-generating agents. Moreover, substances such as azobis compounds (azobis-isobutyronitrile) and diazonium compounds may likewise be used as heat-polymerization initiators. The addition-polymerizable compounds are likewise in common with those used in the photopolymerizable system. In this case, the light-heat conversion agent may be any one inasmuch as it may absorb the light emitted from a light source used for the imagewise exposure and therefore, all of the dyes listed above in connection with the photopolymerizable system can be used in this case. In this respect, however, the practically used high power laser beam source for the heat mode exposure is mainly a (near) infrared light source emitting a light beam of not less than 750 nm and therefore, the most useful light-heat conversion agent at present is a compound capable of absorbing the (near) infrared light rays. A variety of IR absorbing agents are commercially available, but most preferably used herein are, for instance, hepta-methine cyanine dyes, phthalocyanine dyes and carbon black.

Incidentally, the light-sensitive resin composition used in the present invention may further comprise various kinds of additives depending on a variety of purposes, for instance, various kinds of hydrophobic group-containing resins such as octylphenol-formaldehyde resins, t-butylphenol-formaldehyde resins, t-butylphenol-benzaldehyde resins, rosin-modified novolak resins and o-naphthoquinonediazide-sulfonic acid esters of these modified novolak resins for the improvement of the ink-receptivity of images and plasticizers such as dibutyl phthalate, dioctyl phthalate, butyl glycolate, tricresyl phosphate and dioctyl adipates for the improvement of the flexibility of the resulting film. The added amount of these additives preferably ranges from 0.01 to 30% by weight on the basis of the total solid content of the resin composition.

In addition, these resin composition may further comprise known resins for the further improvement of the wear resistance of the resulting film. Examples of such resins usable herein are polyvinyl acetal resins, polyurethane resins, epoxy resins, vinyl chloride resins, nylons, polyester resins and acrylic resins, which may be used alone or in any combination. The amount thereof to be incorporated into the resin composition preferably ranges from 2 to 40% by weight on the basis of the total solid content of the resin composition.

Moreover, the light-sensitive resin composition used in the present invention may comprise nonionic surfactants such as those disclosed in, for instance, J.P. KOKAI Nos. Sho 62-251740 and Hei 4-68355 and/or amphoteric surfactants such as those disclosed in, for instance, J.P. KOKAI Nos. Sho 59-121044 and Hei 4-13149, for expanding the development latitude. Specific examples of such nonionic surfactants are sorbitan tristearate, sorbitan mono-palmitate, sorbitan trioleate, stearic acid monoglyceride, polyoxyethylene sorbitan monooleate and polyoxyethylene nonylphenyl ether, while specific examples of such amphoteric surfactants include alkyl-di(aminoethyl) glycine, alkyl-polyaminoethyl glycine hydrochloride, AMOGEN K (the trade name of an N-tetradecyl-N,N-betaine type surfactant commercially available from Dai-ichi Kogyo Seiyaku Co., Ltd.), 2-alkyl-N-carboxyethyl-N-hydroxyethyl imidazolinium betaine and REBON 15 (the trade name of an alkyl-imidazoline type surfactant commercially available from Sanyo Chemical Industries, Ltd.). The rate of the light-sensitive resin composition occupied by these nonionic and/or amphoteric surfactants preferably ranges from 0.05 to 15% by weight and more preferably 0.1 to 5% by weight on the basis of the total solid content of the composition.

Improvement of Surface Quality of Coated Film: The light-sensitive resin composition used in the present invention may comprise a surfactant for the improvement of the surface quality of the coated film such as fluorine atom-containing surfactants as disclosed in J.P. KOKAI No. Sho 62-170950. The added amount thereof preferably ranges from 0.001 to 1.0% by weight and more preferably 0.005 to 0.5% by weight on the basis of the total amount of the light-sensitive resin composition (total solid content).

In addition, the light-sensitive resin composition used in the present invention may comprise a dye of yellow color, preferably one whose absorbance observed at 436 nm is not less than 70% of that observed at 417 nm.

When preparing a lithographic printing plate material from the light-sensitive resin composition comprising a fluorine-containing polymer, the composition is applied onto the surface of a substrate as a light-sensitive layer. More specifically, the light-sensitive resin composition comprising a fluorine-containing polymer is dissolved or dispersed in a solvent comprising at least one member selected from the following organic solvents, followed by the application thereof to the surface of a substrate and then drying. Such an organic solvent may be any known and currently used one, but may be selected from those having a boiling point ranging from 40 to 200° C., in particular, 60 to 160° C. from the viewpoint of advantages observed upon drying. In this respect, it is a matter of course that the solvent is selected from those capable of dissolving the fluorine-containing polymer used in the invention.

Specific examples of organic solvents are alcohols such as methyl alcohol, ethyl alcohol, n- or iso-propyl alcohol, n- or iso-butyl alcohol and diacetone alcohol; ketones such as acetone, methyl ethyl ketone, methyl propyl ketone, methyl butyl ketone, methyl amyl ketone, methyl hexyl ketone, diethyl ketone, di-isobutyl ketone, cyclohexanone, methyl cyclohexanone and acetyl acetone; hydrocarbons such as benzene, toluene, xylene, cyclohexane and methoxy benzene; acetic acid esters such as ethyl acetate, n- or iso-propyl acetate, n- or iso-butyl acetate, ethylbutyl acetate and hexyl acetate; halides such as methylene dichloride, ethylene dichloride and monochloro-benzene; ethers such as isopropyl ether, n-butyl ether, dioxane, dimethyl dioxane and tetrahydrofuran; polyhydric alcohols and derivatives thereof such as ethylene glycol, methyl cellosolve, methyl cellosolve acetate, ethyl cellosolve, diethyl cellosolve, cellosolve acetate, butyl cellosolve, butyl cellosolve acetate, methoxy-methoxy ethanol, diethylene glycol monomethyl ether, diethylene glycol dimethyl ether, diethylene glycol methyl-ethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether and 3-methyl-3-methoxy butanol; and special solvents such as dimethylsulfoxide and N,N-dimethyl-formamide, which may suitably be used alone or in any combination. The concentration of the solid contents present in the resin composition to be applied suitably ranges from 2 to 50% by weight.

The method for coating the resin composition used in the present invention may be, for instance, roll coating, dip coating, air-knife coating, gravure coating, gravure-offset coating, hopper coating, blade coating, wire-doctor coating and spray coating techniques and the amount of the composition to be coated preferably ranges from 0.3 to 4.0 g/m$^2$ as expressed in terms of the weight weighed after drying. The smaller the coated amount of the composition, the smaller the quantity of exposed light for obtaining images, but the strength of the resulting film is reduced. On the other hand, the higher the amount of the composition to be coated, the higher the quantity of exposed light for obtaining images, but the strength of the light-sensitive film increases. For instance, when the resulting material is used as a printing plate, the latter would provide an increased number of acceptable printed matters (in other words, the printing plate has a high printing durability).

The drying of the light-sensitive resin composition applied onto the substrate is in general conducted using heated air. The temperature of the heated air suitably ranges from 30 to 200° C., in particular, 40 to 140° C. The drying temperature may be maintained at a constant level or may stepwise be increased. In some cases, good results would be obtained by removing any humidity in the air for drying. The heated air is preferably supplied to the coated surface at a rate ranging from 0.1 m/sec to 30 m/sec, in particular, 0.5 to 20 m/sec.

Matting Layer: A matting layer is preferably formed on the surface of the light-sensitive layer applied according to the foregoing method for reducing the time required for the evacuation upon contact exposure using a vacuum printing frame and for the prevention of the formation of any indistinct image during printing. More specifically, the matting layer can be formed by, for instance, a method as disclosed in J.P. KOKAI No. Sho 50-125805 and J.P. KOKOKU No. Sho 57-6582 or a method in which solid powder is thermally fusion-bonded to the surface as disclosed in J.P. KOKOKU No. Sho 62-62337.

The substrate used in, for instance, lithographic printing plate is a dimensionally stable plate-like material and preferably used herein include those conventionally used as substrates for printing plates. Examples of such substrates include paper; paper laminated with a plastic film (such as polyethylene, polypropylene or polystyrene film); metal plates of, for instance, aluminum (including alloys thereof), zinc, iron and copper; plastic films of, for instance, cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate and polyvinyl acetal; and paper or plastic films on which the foregoing metals are deposited or paper or plastic films laminated with foils of the foregoing metals, with aluminum plates being particularly preferred as the substrates for the lithographic printing plate. Examples of aluminum plates include pure aluminum plate and aluminum alloy plates. A variety of aluminum alloys may be used herein and examples thereof are those of aluminum with other metal such as silicon, copper, manganese, magnesium, chromium, zinc, lead, bismuth and/or nickel. These alloys comprise a negligible amount of impurities in addition to minor amounts of iron and titanium.

The substrate is if necessary subjected to a surface treatment. For instance, in case of light-sensitive lithographic printing plate, the surface of the substrate used is hydrophilized. Moreover, when the substrate has a metal, in particular, aluminum surface, the substrate is preferably subjected to a surface-treatment such as a graining treatment, a treatment of dipping the same in an aqueous solution of, for instance, sodium silicate, potassium fluorozirconate or a phosphoric acid salt, or an anodization treatment. Preferably used herein also include, for instance, an aluminum plate, which is grained and then treated by dipping in an aqueous solution of sodium silicate as disclosed in U.S. Pat. No. 2,714,066 and an aluminum plate, which is subjected to an anodization treatment and then a treatment of dipping the anodized plate in an aqueous solution of an alkali metal silicate as disclosed in U.S. Pat. No. 3,181,461. The foregoing anodization treatment is carried out by passing an electric current through a system in which the aluminum plate serves as an anode in an electrolyte selected from the group consisting of aqueous or non-aqueous solutions of, for instance, inorganic acids such as phosphoric acid, chromic acid, sulfuric acid and boric acid or organic acids such as oxalic acid and sulfamic acid or salts thereof and mixtures of these aqueous or non-aqueous solutions.

Moreover, the silicate electrodeposition as disclosed in U.S. Pat. No. 3,658,662 is also effective as a surface treatment of the substrate. The hydrophilization treatment is applied to the substrate not only for making the surface thereof hydrophilic, but also for preventing the occurrence of any harmful reaction with the light-sensitive resin composition applied onto the substrate and for improving the adhesion between the light-sensitive layer and the substrate. Prior to the graining of the aluminum plate, the surface thereof may, if necessary, be subjected to pre-treatments for the removal of the rolling oil on the surface and for the exposure the clean aluminum surface. To remove the rolling oil, there has been used, for instance, a solvent such as trichlene and a surfactant. In addition, to expose the clean aluminum surface, there has widely been used a method, which makes use of an alkali etching agent such as sodium hydroxide or potassium hydroxide.

Methods for graining effectively used herein include, for instance, mechanical, chemical and/or electrochemical methods. Examples of such mechanical methods are ball-polishing methods, ball-polishing methods, blast-polishing methods and brush-polishing in which the substrate surface is rubbed with a nylon brush in the presence of an aqueous dispersion or slurry of an abrasive such as pumice stone, examples of such chemical methods suitably used herein include those in which the substrate is dipped in a saturated aqueous solution of an aluminum salt of a mineral acid, as disclosed in J.P. KOKAI No. Sho 54-31187 and examples of the foregoing electrochemical methods are those in which the substrate is electrolyzed in an acidic electrolyte such as those comprising hydrochloric acid, sulfuric acid or mixture thereof, using an alternating current. Among these surface-roughening treatments, the surface-roughening method comprising the combination of mechanical and electrochemical surface-roughening treatments as disclosed in J.P. KOKAI No. Sho 55-137993 is preferably used herein since the ink-receptive images are strongly adhered to the substrate surface. The graining according to the foregoing method is preferably carried out to such an extent that the centerline surface roughness (Ra) of the resulting aluminum plate falls within the range of from 0.3 to 1.0 $\mu$m. The aluminum substrate thus surface-grained is, if necessary, subjected to water washing and chemical etching treatments.

The foregoing etching solution is in general selected from aqueous solutions of bases or acids capable of dissolving aluminum. In this case, the etching solution should be one whose components never form any coating film of other than aluminum. Examples of etching agents preferably used herein are basic substances such as sodium hydroxide, potassium hydroxide, trisodium phosphate, disodium phosphate, tripotassium phosphate and dipotassium phosphate, and acidic substances such as sulfuric acid, persulfuric acid, phosphoric acid, hydrochloric acid and salts thereof. On the other hand, the use of salts of metals, whose ionization tendency is lower than that of aluminum such as zinc, chromium, cobalt, nickel and copper, is not preferred since they are liable to form unnecessary coating films on the film to be etched. The concentration of these etching agents and the setting of the etching temperature should most preferably be determined such that the rate of dissolving aluminum or an alloy used falls within the range of from 0.3 to 40 $g/m^2$ per unit (one minute) immersion time, but the rate of dissolution may be beyond the range defined above.

The etching process may be conducted by, for instance, immersing an aluminum plate in the foregoing etching solution or applying the etching solution onto the surface of an aluminum plate and the aluminum plate is preferably treated with such an etching solution such that the amount of aluminum removed through the etching ranges from 0.5 to 10 $g/m^2$. It is desirable to use an aqueous solution of a base as the foregoing etching agent since it can ensure a high etching rate. In this case, the etching process is accompanied by the formation of smut and therefore, the aluminum plate is generally subjected to a de-smutting treatment after the etching. In this de-smutting treatment, an acid is in general used and examples of such acids are nitric acid, sulfuric acid, phosphoric acid, chromic acid, hydrofluoric acid and hydrogen borofluoride. The aluminum plate thus etched is, if necessary, washed with water and then anodized. The anodization may be carried out according to the usual method currently used in this field. More specifically, a DC or AC current is passed through the aluminum plate in an aqueous or non-aqueous solution of sulfuric acid, phosphoric acid, chromic acid, oxalic acid, sulfamic acid, benzenesulfonic acid or a mixture of at least two of them to thus form an anodized film on the aluminum substrate.

The conditions for the anodization variously vary depending on the electrolyte used and therefore, cannot unconditionally be determined, but it is in general desirable that the electrolyte concentration ranges from 1 to 80% by weight, the temperature thereof ranges from 5 to 70° C., the current density used ranges from 0.5 to 60 $A/dm^2$, the electric voltage to be applied ranges from 1 to 100 V and the electrolyzation time ranges from 30 seconds to 50 minutes. Among these anodization treatments, particularly preferred are the methods disclosed in G.B. Patent No. 1,412,768 in which an aluminum plate is anodized at a high current density in a sulfuric acid solution and the methods disclosed in U.S. Pat. No. 3,511,661 in which an aluminum plate is anodized using a phosphoric acid solution as the electrolyzation bath. The aluminum plate thus surface-roughened and then anodized according to the foregoing methods may if necessary be hydrophilized and preferred examples of such hydrophilization treatments are methods comprising treating the same with an alkali metal silicate such as an aqueous sodium silicate solution disclosed in U.S. Pat. Nos. 2,714,066 and 3,181,461, with potassium fluorozirconate as disclosed in J.P. KOKOKU No. Sho 36-22063 and with polyvinyl phosphonic acid as disclosed in U.S. Pat. No. 4,153,461.

Organic Undercoating Layer: In the light-sensitive lithographic printing plate according to the present invention, an organic undercoating layer is preferably applied onto the surface of a substrate prior to the application of a light-sensitive layer thereto for reducing the possibility of remaining any light-sensitive layer on the non-image area. Examples of organic compounds used for forming such an organic undercoating layer are carboxymethyl cellulose, dextrin, gum arabic, amino group-containing phosphonic acids such as 2-aminoethyl-phosphonic acid, organic phosphonic acids, which may have a substituent, such as phenyl-phosphonic acid, naphthyl-phosphonic acid, alkyl-phosphonic acid, glycerophosphonic acid, methylene-diphosphonic acid and ethylene-diphosphonic acid, organic phosphoric acids, which may have a substituent, such as phenyl-phosphoric acid, naphthyl-phosphoric acid, alkyl-phosphoric acid and glycero-phosphoric acid, organic phosphinic acids, which may have a substituent, such as phenyl-phosphinic acid, naphthyl-phosphinic acid, alkyl-phosphinic acid and glycero-phosphinic acid, amino acids such as glycine and β-alanine, and hydrochlorides of hydroxyl group-containing amines such as triethanolamine hydrochloride, which may be used alone or in any combination.

Alternatively, it is also possible to use at least one compound selected from the group consisting of polymeric compounds having, in the molecule, structural units represented by, for instance, poly(p-vinyl benzoate). Specific examples thereof are copolymers of p-vinyl benzoate with vinyl-benzyl-triethyl ammonium salts and copolymers of p-vinyl benzoate with vinyl-benzyl-triethyl ammonium chloride.

This organic undercoating layer can be applied to the surface of a substrate according to the following method. More specifically, the organic undercoating layer is, for instance, formed by a method, which comprises the steps of applying, onto the surface of an aluminum plate, a solution prepared by dissolving the foregoing organic compound in water, an organic solvent such as methanol, ethanol or methyl ethyl ketone or mixture thereof and then drying; or a method, which comprises the steps of dipping an aluminum plate in a solution prepared by dissolving the foregoing organic compound in water, an organic solvent such as methanol, ethanol or methyl ethyl ketone or mixture thereof to thus adsorb the organic compound on the aluminum plate, washing with, for instance, water and then drying. In the former method, the solution of the foregoing organic compound having a concentration ranging from 0.005 to 10% by weight can be applied to the aluminum plate according to a variety of methods such as bar coater coating, whirler coating, spray coating or curtain coating technique. In the latter method, the concentration of the solution ranges from 0.01 to 20% by weight, preferably 0.05 to 5% by weight, the dipping temperature ranges from 20 to 90° C., preferably 25 to 50° C. and the dipping time ranges from 0.1 second to 20 minutes and preferably 2 seconds to one minute.

The solution used for the application of an organic undercoating layer may comprise a basic substance such as ammonia, triethylamine, or potassium hydroxide or an acidic substance such as hydrochloric acid or phosphoric acid to control the pH value of the solution and the pH value thereof may fall within the range of from 1 to 12. Moreover, a yellow dye may be added to the solution for the improvement of the tone reproduction of the light-sensitive lithographic printing plate. The solution may further comprise a compound represented by the following general formula (a):

$$(OH)_x\text{-}R^7\text{—}(COOH)_y \qquad (a)$$

Wherein $R^7$ represents a substituted or unsubstituted arylene group having not more than 14 carbon atoms and x and y each independently represents an integer ranging from 1 to 3. Specific examples of the foregoing compounds represented by Formula (a) are 3-hydroxybenzoic acid, 4-hydroxybenzoic acid, salicylic acid, 1-hydroxy-2-naphthoic acid, 2-hydroxy-1-naphthoic acid, 2-hydroxy-3-naphthoic acid, 2,4-dihydroxybenzoic acid and 10-hydroxy-9-anthracenecarboxylic acid. The amount of the organic undercoating layer to be applied suitably ranges from 1 to 100 mg/m² and preferably 2 to 70 mg/m² as expressed in terms of the amount weighed after drying. This is because if the coated amount of the layer is less than 1 mg/m², the resulting printing plate never shows sufficient printing durability, while if it exceeds 100 mg/m², the same result would be observed.

Back Coat: A back coat is if necessary formed on the back face of the substrate. Examples of such back coats preferably used herein are those derived from organic polymer compounds as disclosed in J.P. KOKAI No. Hei 5-45885 and those comprising metal oxides obtained by hydrolyzing and polycondensing organic or inorganic metal compounds as disclosed in J.P. KOKAI No. Hei 6-35174. Among these materials for forming these coated layers, particularly preferred are alkoxy compounds of silicon such as $Si(OCH_3)_4$, $Si(OC_2H_5)_4$, $Si(OC_3H_7)_4$ and $Si(OC_4H_9)_4$ since they are not expensive and easily available and the coated layers of the metal oxides are excellent in the resistance to developers.

The lithographic printing plate material thus prepared is in general imagewise exposed to light and then developed. As light sources for actinic light rays used for the imagewise exposure, there may be listed, for instance, a mercury lamp, a metal halide lamp, a xenon lamp, a chemical lamp and a carbon arc lamp. Examples of radiant rays are an electron beam, X-rays, an ion beam and far infrared rays. Usable herein also include g-radiations, I-radiations, Deep-UV light rays and a high-density energy beam (laser beam). Examples of laser beams are He—Ne laser, Ar laser, Kr laser, He—Cd laser and KrF excimer laser beams. Moreover, in case of the laser directly exposed type printing plate, preferably used light sources are those emitting light rays having wavelengths falling within the range of from near infrared to infrared, with solid lasers and semiconductor lasers being particularly preferred.

Developers preferably used for developing the lithographic printing plate prepared using the light-sensitive resin composition of the present invention are, for instance, those comprising (a) at least one saccharide selected from non-reducing saccharides and (b) at least one base and having a pH value ranging from 9.0 to 13.5. The developer will hereunder be described in more detail. In this specification, the term "developer" used herein means both development-initiation liquid (developers in a narrow sense) and supplementary developers.

Preferably, this developer comprises at least one compound selected from non-reducing saccharides and at least one base as principal components and has a pH value ranging from 9.0 to 13.5. Such non-reducing saccharides are saccharides, which do not have any free aldehyde and/or ketone groups and do not accordingly show any reducing ability. They are divided into trehalose-type oligosaccharides in which reducing groups are linked together; glycosides in which reducing groups of saccharides are bonded to non-saccharides; and sugar alcohols, which are obtained by reducing saccharides through hydrogenation. All of these three kinds of non-reducing saccharides can suitably be used in the present invention. Examples of trehalose-type oligosaccharides include saccharose and trehalose; examples of glycosides are alkyl glycosides, phenol glycosides and mustard oil glycosides; and examples of sugar alcohols are D,L-arabitol, ribitol, xylitol, D,L-sorbitol, D,L-mannitol, D,L-iditol, D,L-talitol, dulcitol and allo-dulcitol. Moreover, suitably used herein include maltitol obtained by the hydrogenation of disaccharides and reduced derivatives obtained by the hydrogenation of oligosaccharides (reduced starch syrup). Among these non-reducing saccharides, particularly preferred are sugar alcohols and saccharose, with D-sorbitol, saccharose and reduced starch syrup being particularly preferred because of their buffering effect in a moderate pH range and cheapness.

These non-reducing saccharides may be used alone or in any combination of at least two of them and the rate of the developer occupied by these non-reducing saccharides preferably ranges from 0.1 to 30% by weight and more preferably 1 to 20% by weight on the basis of the total weight of the developer.

If the amount of the non-reducing saccharide is less than the lower limit, any sufficient buffering effect of the non-reducing saccharide is not expected at all, while if it exceeds the upper limit, it is difficult to highly concentrate the resulting developer and the production cost thereof would be increased. When a reducing saccharide is used in combination with a base, the resulting developer undergoes browning with time and shows gradual reduction of the pH value thereof. Accordingly, the developer suffers from a problem such that the developing ability is reduced.

The bases used in combination with the foregoing non-reducing saccharides usable herein may be any conventionally known alkaline agents. Specific examples thereof include inorganic alkaline agents such as sodium hydroxide, potassium hydroxide, lithium hydroxide, trisodium phosphate, tripotassium phosphate, triammonium phosphate, disodium phosphate, dipotassium phosphate, di-ammonium phosphate, sodium carbonate, potassium carbonate, ammonium carbonate, sodium hydrogen carbonate, potassium hydrogen carbonate, ammonium hydrogen carbonate, sodium borate, potassium borate and ammonium borate. Specific examples of such bases also usable herein include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, mono-isopropanolamine, diisopropanolamine, ethyleneimine, ethylenediamine and pyridine.

These alkaline agents may be used alone or in any combination of at least two thereof. Among these alkaline agents, preferred are sodium hydroxide and potassium hydroxide. This is because the pH value of the resulting developer can be controlled over a wide pH range by adjusting the amount of the alkaline agent relative to that of the non-reducing saccharide. Moreover, the alkaline agents also preferably used herein include, for instance, trisodium phosphate, tripotassium phosphate, sodium carbonate and potassium carbonate since these agents as such have buffering effects. These alkaline agents are incorporated into the developer so that the pH value of the developer falls within the range of from 9.0 to 13.5 and the amount thereof is thus determined depending on the desired pH value and the kinds and added amounts of the non-reducing saccharides selected, but the developer more preferably has a pH value ranging from 10.0 to 13.2.

Moreover, the developer may likewise simultaneously comprise an alkaline buffer solution containing a weak acid other than saccharides and a strong base. The weak acid used in such a buffer solution is preferably one having a dissociation constant (pKa) ranging from 10.0 to 13.2. Such an acid is selected from those described in "Ionization Constants of Organic Acids in Aqueous Solution", published by Pergamon Press Publishing Company and specific examples thereof are alcohols such as 2,2,3,3-tetrafluoropropanol-1 (pKa 12.74), trifluoro-ethanol (pKa 12.37) and trichloro-ethanol (pKa 12.24); aldehydes such as pyridine-2-aldehyde (pKa 12.68) and pyridine-4-aldehyde (pKa 12.05); phenolic hydroxyl group-containing compounds such as salicylic acid (pKa 13.0), 3-hydroxy-naphthoic acid (pKa 12.84), catechol (pKa 12.6), gallic acid (pKa 12.4), sulfo-salicylic acid (pKa 11.7), 3,4-dihydroxy-sulfonic acid (pKa 12.2), 3,4-dihydroxy-benzoic acid (pKa 11.94), 1,2,4-trihydroxy-benzene (pKa 11.82), hydroquinone (pKa 11.56), pyrogallol (pKa 11.34), o-cresol (pKa 10.33), resorcinol (pKa 11.27), p-cresol (pKa 10.27) and m-cresol (pKa 10.09); oximes such as 2-butanone-oxime (pKa 12.45), acetoxime (pKa 12.42), 1,2-cycloheptanedione-dioxime (pKa 12.3), 2-hydroxybenzaldehyde-oxime (pKa 12.10), dimethyl-glyoxime (pKa 11.9), ethane-diamide-dioxime (pKa 11.37) and acetophenone-oxime (pKa 11.35); nucleic acid-related substances such as adenosine (pKa 12.56), inosine (pKa 12.5), guanine (pKa 12.3), cytosine (pKa 12.2), hypoxanthine (pKa 12.1) and xanthine (pKa 11.9); and other weak acids such as diethylamino-methyl phosphonic acid (pKa 12.32), 1-amino-3,3,3-trifluorobenzoic acid (pKa 12.29), isopropylidene diphosphonic acid (pKa 12.10), 1,1-ethylidene-diphosphonic acid (pKa 11.54), 1,1-ethylidene-diphosphonic acid 1-hydroxy (pKa 11.52), benzimidazole (pKa 12.86), thiobenzamide (pKa 12.8), picoline-thioamide (pKa 12.55) and barbituric acid (pKa 12.5).

Among these weak acids, preferred are sulfo-salicylic acid and salicylic acid. The bases preferably used in combination with these weak acids are sodium hydroxide, ammonium hydroxide, potassium hydroxide and lithium hydroxide. These alkaline agents may be used alone or in combination of at least two thereof. The foregoing various kinds of alkaline agents are used such that the pH value of the developer falls within a desired range, by properly adjusting the concentration and combination of the agents.

The developer may, if necessary, comprise a variety of surfactants and/or organic solvent for the promotion of the development, dispersion of development scum and the improvement of the affinity of the image area of the printing plate with ink. Preferred surfactants are, for instance, anionic, cationic, nonionic and amphoteric ones.

Examples of preferred surfactants are nonionic surfactants such as polyoxy-ethylene alkyl ethers, polyoxyethylene alkylphenyl ethers, polyoxyethylene polystyryl-phenyl ethers, polyoxyethylene polyoxypropylene alkyl ethers, partial esters of glycerin fatty acids, partial esters of sorbitan fatty acids, partial esters of pentaerythritol fatty acids, propylene glycol mono-fatty acid esters, partial esters of sucrose fatty acids, partial esters of polyoxyethylene sorbitan fatty acids, partial esters of polyoxyethylene sorbitol fatty acids, polyethylene glycol fatty acid esters, partial esters of polyglycerin fatty acids, polyoxyethylene-modified castor oils, partial esters of polyoxyethylene glycerin fatty acids, fatty acid diethanol-amides, N,N-bis-2-hydroxyalkylamines, polyoxyethylene alkylamines, triethanolamine fatty acid esters and trialkylamine oxides; fatty acid salts, abietic acid salts, hydroxyalkane-sulfonic acid salts, alkane-sulfonic acid salts, dialkylsulfo-succinic acid ester salts, linear alkylbenzene-sulfonic acid salts, branched alkylbenzene-sulfonic acid salts, alkylnaphthalene-sulfonic acid salts, alkylphenoxy polyoxyethylene propyl-sulfonic acid salts, polyoxyethylene alkylsulfo-phenyl ether salts, sodium salt of N-methyl-N-oleyltaurine, disodium salts of N-alkylsulfo-succinic acid monoamides, petroleum sulfonic acid salts, sulfated tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkylphosphoric acid ester salts, polyoxyethylene alkyl ether phosphoric acid ester salts, polyoxyethylene alkyl-phenyl ether phosphoric acid ester salts, partially saponified products of styrene-maleic anhydride copolymers and partially saponified products of olefin-maleic anhydride copolymers; anionic surfactants such as naphthalene sulfonic acid salts-formalin condensates; cationic surfactants such as alkylamine salts, quaternary ammonium salts (for instance, tetrabutylammonium bromide), polyoxyethylene alkylamine salts and polyethylene polyamine derivatives; and amphoteric surfactants such as carboxy betaines, aminocarboxylic acids, sulfobetaines, amino-sulfuric acid esters and imidazolines. The term "polyoxyethylene" appearing in the nomenclature of the foregoing surfactants may be replaced with "polyoxyalkylene" such as "polyoxy-methylene", "polyoxypropylene" and "polyoxybutylene" and such surfactants may likewise be included in the present invention.

More preferred surfactants usable herein include, for instance, fluorine atom-containing surfactants containing perfluoroalkyl groups in the molecule. Examples of such fluorine atom-containing surfactants are anionic type ones such as perfluoroalkyl carboxylic acid salts, perfluoroalkyl sulfonic acid salts and perfluoroalkyl phosphoric acid salts; amphoteric type ones such as perfluoroalkyl betaines; cationic type ones such as perfluoroalkyl trimethyl ammonium salts; and nonionic type ones such as perfluoroalkylamine oxides, perfluoroalkyl-ethylene oxide adducts, oligomers containing perfluoroalkyl groups and hydrophilic groups, oligomers containing perfluoroalkyl groups and lipophilic groups, oligomers containing perfluoroalkyl groups, hydrophilic groups and lipophilic groups and urethanes containing perfluoroalkyl groups and lipophilic groups. The foregoing surfactants may be used alone or in any combination of at least two of them. These surfactants are added to the developer in an amount ranging from 0.001 to 10% by weight and more preferably 0.01 to 5% by weight on the basis of the total amount of the developer.

The developer used in the invention may comprise a variety of development stabilizers. Examples of such stabilizers preferably used herein are polyethylene glycol adducts of sugar alcohols as disclosed in J.P. KOKAI No. Hei 6-282079, tetraalkyl ammonium salts such as tetrabutyl ammonium hydroxide, phosphonium salts such as tetrabutyl-phosphonium bromide and iodonium salts such as diphenyl-iodonium chloride. Preferred examples thereof further include anionic or amphoteric surfactants disclosed in J.P. KOKAI No. Sho 50-51324, water-soluble cationic polymers disclosed in J.P. KOKAI No. Sho 55-95946 and water-soluble amphoteric polyelectrolytes disclosed in J.P. KOKAI No. Sho 56-142528.

Examples of such stabilizers for the developer further include organic boron atom-containing compounds to which alkylene glycols are added as disclosed in J.P. KOKAI No. Sho 59-84241, polyoxyethylene-polyoxypropylene block polymer-type water-soluble surfactants disclosed in J.P. KOKAI No. Sho 60-111246, alkylene-diamine compounds substituted with polyoxyethylene-polyoxypropylene disclosed in J.P. KOKAI No. Sho 60-129750, polyethylene glycols having a weight average molecular weight of not less than 300 disclosed in J.P. KOKAI No. Sho 61-215554, cationic group-containing fluorine atom-containing surfactants disclosed in J.P. KOKAI No. Sho 63-175858, water-soluble ethylene oxide-added compounds obtained by adding not less than 4 moles of ethylene oxide to acids or alcohols as disclosed in J.P. KOKAI No. Hei 2-39157 and water-soluble polyalkylenes compounds.

The developer used herein further comprises, if necessary, an organic solvent. Such an organic solvent is suitably selected from those having a solubility in water of not more than about 10% by weight and preferably not more than 5% by weight. Specific examples thereof include 1-phenyl ethanol, 2-phenyl ethanol, 3-phenyl-1-propanol, 4-phenyl-1-butanol, 4-phenyl-2-butanol, 2-phenyl-1-butanol, 2-phenoxy ethanol, 2-benzyloxy ethanol, o-methoxybenzyl alcohol, m-methoxybenzyl alcohol, p-methoxy-benzyl alcohol, benzyl alcohol, cyclohexanol, 2-methyl cyclohexanol, 3-methyl cyclohexanol, 4-methyl cyclohexanol, N-phenyl ethanolamine and N-phenyl diethanol-amine.

The content of the organic solvent to be used ranges from 0.1 to 5% by weight on the basis of the total weight of the developer. The amount thereof to be used is closely related to the amount of the surfactant used and the amount of the surfactant to be used is preferably increased as that of the organic solvent increases. This is because if the amount of the surfactant is small and a large amount of the organic solvent is used, the organic solvent is not completely dissolved and this would in turn make it difficult to ensure good developing ability of the resulting developer.

The developer may further comprise a reducing agent. Such a reducing agent may serve to inhibit any contamination of a printing plate during development and the use thereof is effective, in particular, in the development of a negative light-sensitive lithographic printing plate containing a light-sensitive diazonium salt compound. Examples of organic reducing agent preferably used herein include phenol compounds such as thiosalicylic acid, hydroquinone, Metol, methoxy-quinone, resorcin and 2-methyl-resorcin and amine compounds such as phenylene-diamine and phenyl hydrazine. In addition, examples of inorganic reducing agents preferably used herein are salts such as sodium, potassium and ammonium salts of inorganic acids such as sulfurous acid, hydrogen-sulfurous acid, phosphorous acid, hydrogen-phosphorous acid, dihydrogen-phosphorous acid, thiosulfuric acid and dithionic acid. Among these reducing agents, sulfites are particularly excellent in the contamination-inhibitory effect. The developer comprises these reducing agents preferably in an amount ranging from 0.05 to 5% by weight on the basis of the weight of the developer practically used.

The developer may further comprise an organic carboxylic acid. Organic carboxylic acids preferably used herein are aliphatic and aromatic carboxylic acids having 6 to 20 carbon atoms. Specific examples of aliphatic carboxylic acids are caproic acid, enanthylic acid, capric acid, lauric acid, myristic acid, palmitic acid and stearic acid, with alkanoic acids having 8 to 12 carbon atoms being particularly preferred. Moreover, aliphatic carboxylic acids may likewise be unsaturated fatty acids containing double bonds in the carbon chains or those having branched carbon chains. The aromatic carboxylic acids are compounds having benzene, naphthalene and anthracene rings, which are substituted with carboxyl groups and specific examples thereof are o-chlorobenzoic acid, p-chlorobenzoic acid, o-hydroxybenzoic acid, p-hydroxy-benzoic acid, o-aminobenzoic acid, p-aminobenzoic acid, 2,4-dihydroxy-benzoic acid, 2,5-dihydroxy-benzoic acid, 2,6-dihydroxy-benzoic acid, 2,3-dihydroxy-benzoic acid, 3,5-dihydroxy-benzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid, with hydroxy naphthoic acids being particularly effective.

The foregoing aliphatic and aromatic carboxylic acids are preferably used in the form of sodium, potassium or ammonium salts for the purpose of increasing the water-solubility thereof. In the developer used in the invention, the content of the organic carboxylic acid is not particularly restricted, but if the content thereof is less than 0.1% by weight, the effect thereof is insufficient, while if it is not less than 10% by weight, not only any further improvement of the effect is not expected, but also when simultaneously using other additives, the presence thereof would sometimes interfere with the dissolution of the additives. For this reason, the added amount of the carboxylic acid preferably ranges from 0.1 to 10% by weight and more preferably 0.5 to 4% by weight on the basis of the total amount of the developer practically used.

Further, the developer may comprise, if necessary, other additives such as a preservative, a coloring agent, a thickening agent, an antifoaming agent and a water softener. Examples of water softeners are polyphosphoric acid and sodium, potassium and ammonium salts thereof; aminopolycarboxylic acids and sodium, potassium and ammonium salts thereof such as ethylenediaminetetraacetic acid, diethylenetriamine-pentaacetic acid, triethylenetetraminehexaacetic acid, hydroxyethyl ethylenediamine-triacetic acid, nitrilotriacetic acid, 1,2-diaminocyclohexanetetraacetic acid and 1,3-diamino-2-propanoltetraacetic acid; and aminotri(methylene-phosphonic acid), ethylenediaminetetra(methylene-phosphonic acid), diethylenetriaminepenta-(methylene-phosphonic acid), triethylenetetraminehexa(methylene-phosphonic acid), hydroxyethyl ethylenediaminetri(methylene-phosphonic acid) and 1-hydroxyethane-1,1-diphosphonic acid and sodium, potassium and ammonium salts thereof.

The optimum amount of the water softener may vary depending on the chelating ability thereof, the hardness and amount of water used, but the amount thereof used in general ranges from 0.01 to 5% by weight and more preferably 0.01 to 0.5% by weight on the basis of the amount of the developer practically used. If the amount of the softener is less than the lower limit, the intended purpose cannot sufficiently be accomplished, while if it exceeds the upper limit, image areas are adversely affected, for instance, there would be observed color blinding. The balance of the developer is water. The developer is stored in the form of a concentrate whose water content is lower than that of the developer practically used and is diluted with water immediately before the practical use. This concentrate is quite convenient from the viewpoint of transportation thereof. In this case, the developer is suitably concentrated to such an extent or such a degree of concentration that all of the components of the developer never undergo any separation or precipitation.

Alternatively, the developer disclosed in J.P. KOKAI No. Hei 6-282079 may be used as that used for the development of a lithographic printing plate containing the light-sensitive resin composition according to the present invention. This developer is one containing an alkali metal silicate having a molar ratio: $SiO_2/M_2O$ (wherein M represents an alkali metal) ranging from 0.5 to 2.0 and a water-soluble ethylene oxide-added compound prepared by adding not less than 5 moles of ethylene oxide to a sugar alcohol carrying at least 4 hydroxyl groups. In this respect, the sugar alcohol is a polyhydric alcohol corresponding to that obtained by reducing the aldehyde and ketone groups of sugar into primary and secondary alcohol groups, respectively. Specific examples of such sugar alcohols are D,L-threitol, erythritol, D,L-arabitol, ribitol, xylitol, D,L-sorbitol, D,L-mannitol, D,L-iditol, D,L-talitol, dulcitol and allo-dulcitol as well as di-, tri-, tetra-, penta- and hexa-glycerin obtained by condensing sugar alcohols. The foregoing water-soluble ethylene oxide adducts each can be prepared by adding not less than 5 moles of ethylene oxide to one mole of the foregoing sugar alcohol. Moreover, the ethylene oxide adducts may, if necessary, be further block-copolymerized with propylene oxide to such an extent that a desired solubility of the product can be ensured. These ethylene oxide adducts may be used alone or in any combination of at least two of them. The amount of these water-soluble ethylene oxide-adducts to be added suitably ranges from 0.001 to 5% by weight and more preferably 0.001 to 2% by weight on the basis of the amount of the developer (practically used).

The developer may, if necessary, comprise various kinds of surfactants and/or organic solvent such as those listed above for the promotion of the development, dispersion of development scum and the improvement of the affinity of the image area of the printing plate with ink.

The PS plate treated with a developer having such a composition is subjected to post-treatments using a rinsing liquid containing, for instance, washing water and a surfactant, a finisher comprising gum arabic and a starch derivative as principal components and/or a protective gumming solution. In the post-treatments of the PS plate according to the present invention, it is possible to use various combinations of these treatments.

Recently, there has widely been used an automatic developing machine for PS plates for the rationalization and standardization of the plate-making operations in the fields of patterned plates and printing. This automatic developing machine in general comprises a developing portion and a post-treatment portion and includes a device for transporting the PS plates, baths or tanks for accommodating processing liquids and a spraying device. In this automatic machine, imagewise exposed PS plates are horizontally conveyed while each processing liquid pumped up is sprayed on the PS plates through a spray nozzle to thus conduct development and post-treatments. Recently, there has also been known a method in which a PS plate is transported and immersed in processing baths each filled with a corresponding processing liquid by means of dipped guide rolls to thus develop and post-treat the PS plate or a method in which a small constant amount of washing water is fed to the plate surface after the development to thus wash the same with water and the resulting waste water is reused as a diluting water for the stock solution of the developer.

In such an automatic processing, the PS plate may be processed while a replenisher for each processing liquid is supplemented to the liquid depending on, for instance, the throughput and the running time of the machine. Alternatively, the so-called disposition method may be used, in which a PS plate is processed with a substantially fresh processing liquid. The lithographic printing plate prepared after such treatments is fitted to an offset printing press to obtain a plurality of printed matters.

The present invention will hereunder be described in more detail with reference to the following working Examples,

EXAMPLES 1 TO 10 AND COMPARATIVE EXAMPLES 1 AND 2

A JIS A 1050 aluminum plate having a thickness of 0.24 mm was subjected to a brush-graining treatment in which the plate was rubbed with the following rotating nylon brushes while supplying an aqueous suspension of pumice stone having an average particle size of about 2.1 μm. A first brush had a bristle length of 100 mm, a bristle diameter of 0.95 mm and a plantation density of 70 bristles/cm² and a second brush had a bristle length of 80 mm, a bristle diameter of 0.295 mm and a plantation density of 670 bristles/cm². Both of the rotational frequencies of these two brush rolls were set at 250 rpm. After sufficiently washing the aluminum plate with water subsequent to the brush graining, the plate was etched by immersing it in a 10% sodium hydroxide solution at 60° C. for 25 seconds, followed by washing with running water, rinse and neutralization of the same with a 20% nitric acid solution and then washing with water. The aluminum plate was then subjected to an electrolytic surface-roughening treatment in a 1% nitric acid aqueous solution, at the quantity of electricity at the anode time of 160 coulomb/dm², using a sinusoidal alternating waved current under the condition of VA=12.7 V. At this stage, the surface roughness of the resulting aluminum plate was determined to be 0.79 μm (as expressed in terms of Ra). Subsequently, the plate was immersed in a 1% sodium hydroxide aqueous solution at 40° C. for 30 seconds, further immersed in a 30% sulfuric acid aqueous solution to carry out the desmutting thereof at 60° C. for 40 seconds and then anodized at a current density of 2A/dm², using a DC current so that the weight of the resulting anodized film was equal to 1.6 g/m² to thus prepare a substrate.

An undercoating liquid 1 having the following composition was applied onto the surface of the substrate thus treated and dried at 80° C. for 30 seconds. The amount of the coated film weighed after drying was found to be 10 mg/m².

| (Undercoating Liquid 1) | |
|---|---|
| β-Alanine | 0.10 g |
| Methanol | 40 g |
| Pure Water | 60 g |

Thus, a substrate (I) was prepared. Then 12 ml/m² of a light-sensitive liquid 1 (composition) detailed below was applied onto the substrate (I) according to the rod coating and then dried at 100° C. for one minute to give a positive light sensitive presensitized plate for preparing a lithographic printing plate. The amount of the coated liquid weighed after drying was found to be 1.15 g/m². Moreover, a matting layer was formed according to the disclosure of J.P. KOKOKU No. Sho 61-28986 in order to reduce the time required for the adhesion under vacuum.

| (Composition of Light-Sensitive Liquid 1) | |
|---|---|
| Component | Amt. (g) |
| Esterified product of 1,2-diazonaphthoquinone-5-sulfonylchloride and pyrogallol-acetone resin (the substance disclosed in Example 1 of U.S. Pat. No. 3,635,709) | 0.8 |
| Cresol-formaldehyde novolak resin (m/p ratio 6:4; weight average molecular weight 8000) | 1.5 |
| Phenol-formaldehyde resin (weight average molecular weight 15,000) | 0.3 |
| Poly[N-(p-aminosulfonylphenyl)acrylamide-co-n-butyl acrylate-co-diethylene glycol monomethyl ether methacrylate] (molar ratio of monomers (in this order) 40:40:20; weight average molecular weight 40,000; number average molecular weight 20,000) | 0.2 |
| p-n-Octylphenol-formaldehyde resin (the substance disclosed in U.S. Pat. No. 4,123,279) | 0.02 |
| Naphthoquinonediazide-1,2-diazide-4-sulfonic acid chloride | 0.01 |
| Tetrahydrophthalic acid anhydride | 0.02 |
| Pyrogallol | 0.05 |
| 4-[p-N,N-Bis(ethoxycarbonyl-methyl)aminophenyl]-2,6-bis(trichloromethyl)-s-triazine | 0.07 |
| A dye obtained by substituting 1-naphthalene-sulfonic acid for the counter-anion of Victoria Pure Blue BOH (available from Hodogaya Chemical Co., Ltd.) | 0.045 |
| Fluorine atom-containing polymer (see Table 2) | See Table 2 |
| MEK/1-methoxy-2-propanol | 15/10 |

TABLE 2

| | Fluorine-containing polymer | Amt. Added (solid content) (g) |
|---|---|---|
| Light-Sensitive Material 1 (Ex.) | P-1 | 0.015 |
| Light-Sensitive Material 2 (Ex.) | P-4 | 0.02 |
| Light-Sensitive Material 3 (Ex.) | P-7 | 0.02 |
| Light-Sensitive Material 4 (Ex.) | P-9 | 0.01 |
| Light-Sensitive Material 5 (Ex.) | P-10 | 0.03 |
| Light-Sensitive Material 6 (Ex.) | P-14 | 0.015 |
| Light-Sensitive Material 7 (Ex.) | P-18 | 0.025 |
| Light-Sensitive Material 8 (Ex.) | P-24 | 0.02 |
| Light-Sensitive Material 9 (Ex.) | P-16 | 0.01 |
| Light-Sensitive Material 10 (Ex.) | P-29 | 0.02 |
| Light-Sensitive Material R1 (Comp. Ex.) | R-1 (having the following structure) | 0.015 |
| Light-Sensitive Material R2 (Comp. Ex.) | R-2* (having the following structure) | 0.025 |
| Light-Sensitive Material R3 (Comp. Ex.) | Not added | None |

*The compound disclosed in Example 1 of J. P. KOKAI No. Sho 62-170950.

R-1

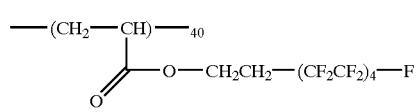 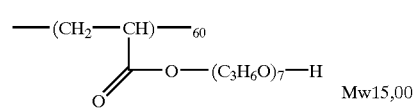

Mw15,000

-continued

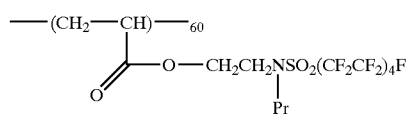 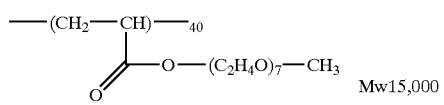

R-2, Mw 15,000

In addition, the surface condition of the coated light-sensitive layer on the light-sensitive printing plate thus prepared was observed with the naked eyes. The surface condition was evaluated on the basis of the number of pinholes formed per unit area of the surface (1 m²).

The presensitized plate for light-sensitive lithographic printing plates thus prepared was evaluated according to the following method. The presensitized plate was exposed to light from a 3 kW metal halide lamp at a distance of 1.5 m from the plate for one minute through a solid manuscript or a manuscript carrying half tone dots, the following developer and FP2W (1:1) (available from Fuji Photo Film Co., Ltd.) as a finisher were introduced into PC Processor 900V (available from Fuji Photo Film Co., Ltd.), the plate was developed in this apparatus at 30° C. for 12 seconds to give a lithographic printing plate. Then printing operations were carried out using R201 Printing Press (available from Roland Company) and GEOS-G (N) (available from Dainippon Ink and Chemicals, Inc.) as ink to examine the number of printed matters required till the image area at the initiation of the printing had a sufficient ink density and to thus determine the number of printed matters required till the plate sufficiently received ink. In this respect, the smaller the numerical value, the better the resulting lithographic printing plate. Moreover, the printing operation was continued till the printed matter caused blurring on the solid portion thereof to determine the number of printed matters obtained before the solid portion underwent blurring and to evaluate the printing durability of the lithographic printing plate. In this connection, the larger the number of acceptable printed matters, the higher the printing durability of the lithographic printing plate. The results thus obtained are summarized in the following Table 3.

(Composition of Developer)

| Component | Amt. (% by weight) |
|---|---|
| Pure water | 90 |
| D-Sorbitol | 6 |
| KOH | 2.5 |

TABLE 3

| Ex. No. | Light-Sensitive Material | Surface Condition | No. of Printed Matters[1] | Printing Durability |
|---|---|---|---|---|
| 1 | 1 | Not more than 5 | 15 | 150,000 |
| 2 | 2 | Not more than 5 | 13 | 160,000 |
| 3 | 3 | Not more than 5 | 16 | 180,000 |
| 4 | 4 | Not more than 5 | 11 | 180,000 |
| 5 | 5 | Not more than 5 | 14 | 160,000 |
| 6 | 6 | Not more than 5 | 12 | 170,000 |
| 7 | 7 | Not more than 5 | 15 | 150,000 |
| 8 | 8 | 5 to 10 | 13 | 160,000 |
| 9 | 9 | Not more than 5 | 16 | 170,000 |
| 10 | 10 | Not more than 5 | 12 | 150,000 |
| 1* | R1 | Not less than 10 | 30 | 120,000 |

TABLE 3-continued

| Ex. No. | Light-Sensitive Material | Surface Condition | No. of Printed Matters[1] | Printing Durability |
|---|---|---|---|---|
| 2* | R2 | Not less than 10 | 25 | 110,000 |
| 3* | R3 | Entirely speckled and non-uniform film | | |

*Comparative Example
[1] The number of printed matters required till the printing plate completely receives ink.

As will be clear from the data listed in Table 3, the light-sensitive layer of the presensitized plate for lithographic printing plates according to the present invention, which makes use of specific fluorine atom-containing polymers is excellent in the uniformity. Moreover, the presensitized plate can provide a lithographic printing plate excellent in both the ink-receptivity and the printing durability. More specifically, it could be recognized that the use of a fluorine atom-containing polymer obtained by selecting a fluorine-containing monomer and a copolymerizable monomer having a specific structure permits the improvement of the coated surface condition of the original lithographic printing plate and the improvement of the ink-receptivity and printing durability of the resulting lithographic printing plate.

EXAMPLES 11 TO 15 AND COMPARATIVE EXAMPLE 4

The same procedures used for the preparation of the light-sensitive material 1 were repeated except that the fluorine atom-containing polymers listed in the following Table 4 were substituted for the fluorine atom-containing polymer used for preparing the material 1 to give presensitized plates for lithographic printing plates or light-sensitive materials 10 to 15 and R4.

TABLE 4

| Light-Sensitive Material No. | Fluorine Atom-Containing Polymer | Amt. Added (Conc. of solid Content (g)) |
|---|---|---|
| 11 (Ex.) | P-3 | 0.015 |
| 12 (Ex.) | P-6 | 0.02 |
| 13 (Ex.) | P-9 | 0.05 |
| 14 (Ex.) | P-15 | 0.06 |
| 15 (Ex.) | P-23 | 0.1 |
| R4 (Comp. Ex.) | R-3 (having the following structure) | 0.1 |

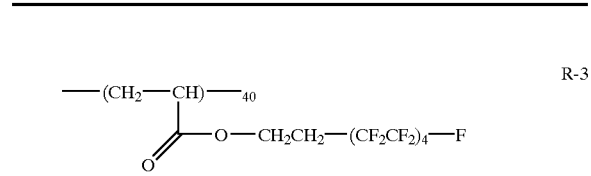

R-3

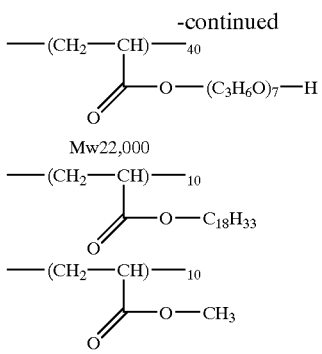

Mw 22,000

The presensitized plates for light-sensitive lithographic printing plates thus prepared were evaluated according to the following methods. The sensitivity thereof was evaluated by means of the number of clear steps, which was determined by exposing them to the light rays from a 3 kW metal halide lamp positioned at a distance of 1 m from the presensitized plate for one minute through a step wedge (density difference between every neighboring two steps was set at 0.15) (available from Fuji Photo Film Co., Ltd.) and developing each exposed plate with an aqueous solution having a molar ratio: $SiO_2/K_2O$ of 1.16 and an $SiO_2$ concentration of 1.4% as a developer in PS Processor 900V (available from Fuji Photo Film Co., Ltd.) to thus determine the number of clear steps for each plate. In this respect, the higher the number of clear steps, the higher the sensitivity of the corresponding presensitized plate. The gradation was herein defined to be the difference between the number of clear steps of each sample determined by the foregoing method and the number of solid steps thereof. Regarding the gradation, the lower the difference, the higher the contrast of the corresponding sample. The development latitude of each sample was expressed in terms of the pH-dependent change in the number of solid steps, which was determined by repeating the same procedures for exposure to light and development used for the determination of the sensitivity except that the pH value of the developer was increased and decreased by 0.2 relative to that of the foregoing developer as a standard to thus determine the intended change. In this respect, the smaller the resulting value or change, the better the development latitude of each sample. The results thus obtained are summarized in the following Table 5.

TABLE 5

| Ex. No. | Light-Sensitive Material No. | Sensitivity | Gradation | Development Latitude |
|---|---|---|---|---|
| 11 | 11 | 6.0 | 5.5 | 6 |
| 12 | 12 | 6.25 | 5.0 | 5 |
| 13 | 13 | 6.25 | 5.0 | 5 |
| 14 | 14 | 6.0 | 5.25 | 6 |
| 15 | 15 | 6.0 | 5.5 | 5 |
| 4* | R4 | 5.75 | 6.0 | 7 |

*Comparative Example

As will be clear from the data listed in Table 5, the contrast of each product of Examples 11 to 15 is increased without any reduction of the sensitivity and the development latitude thereof is also excellent.

EXAMPLES 16 TO 20 AND COMPARATIVE EXAMPLES 5 TO 7

A band-like aluminum plate having a thickness of 0.3 mm and a width of 1,000 mm was first passed through a 10% sodium tertiary phosphate aqueous solution maintained at 80° C. for one minute to carry out degreasing of the aluminum plate. Then the surface of the aluminum plate was grained using a nylon brush and an aqueous suspension of pumice stone (400 mesh) and sufficiently washed with water. Subsequently, the plate was etched by immersing it in a 25% sodium hydroxide aqueous solution maintained at 45° C. for 9 seconds, followed by washing with water, immersion thereof in a 20% nitric acid solution for 20 seconds and washing with water. At this stage, the amount of aluminum removed from the grained aluminum plate through the etching was found to be about 8 $g/m^2$. Then this plate was anodized in a 7% sulfuric acid solution as an electrolyte at a DC current density of 15 $A/dm^2$ to form an anodized film in an amount of 3 $g/m^2$, followed by washing the plate with water, drying the same and application of the following light-sensitive liquid 2 onto the surface of the aluminum plate thus treated.

| (Composition of Light-Sensitive Liquid 2) | |
|---|---|
| Component | Amt. (g) |
| Esterified product of naphthoquinone-1,2-diazide-5-sulfonylchloride and pyrogallol-acetone resin (the substance disclosed in Example 1 of U.S. Pat. No. 3,635,709) | 0.90 |
| Cresol-formaldehyde resin (the substance disclosed in U.S. Pat. No. 4,123,279) | 2.00 |
| t-Butylphenol-formaldehyde resin (the substance disclosed in U.S. Pat. No. 4,123,279) | 0.05 |
| Naphthoquinone-1,2-diazide-5-sulfonylchloride | 0.03 |
| Oil Blue #603 (available from ORIENT Chemical Industries Inc.) | 0.05 |
| Fluorine atom-containing polymer (see Table 6) | 0.015 |
| Methyl ethyl ketone | 8 |
| Propylene glycol monomethyl ether | 25 |

The foregoing coating liquid was continuously applied onto the surface of the grained band-like aluminum plate at a rate of 30 $g/m^2$, followed by drying the same by passing it through a hot air-drying zone maintained at 100° C. for one minute to thus form a light-sensitive layer.

TABLE 6

| Ex. No. | Fluorine Atom-Containing Polymer | Uniformity of Light-Sensitive Layer[1] | No. Of Printed Matters[2] | Printing Durability (No. Of Sheet) |
|---|---|---|---|---|
| 16 | P-2 | A | 25 | 150,000 |
| 17 | P-6 | A | 24 | 160,000 |
| 18 | P-9 | A | 25 | 150,000 |
| 19 | P-15 | A | 26 | 170,000 |
| 20 | P-24 | A | 24 | 160,000 |
| 5* | R-1 | B | 30 | 120,000 |
| 6* | R-2 | A | 36 | 130,000 |
| 7* | Not added | D | 25 | 100,000 |

*Comparative Example
[1]This was evaluated on the basis of the following criteria:
A: Uniform and even;
B: Slightly and lightly uneven;
C: There was observed unevenness due to, for instance, the drying air-blow; and
D: There was observed considerable unevenness due to, for instance, the drying air-blow.
[2]The number of printed matters required till the printing plate completely receives ink.

As will be seen from the data listed in Table 6, the light-sensitive layers prepared in Examples 16 to 20 using the fluorine atom-containing surfactant according to the present invention have a quite uniform film thickness as compared with that observed for the light-sensitive layer prepared in Comparative Example 7 without using any such surfactant. Moreover, the light-sensitive layers prepared in Comparative Examples 5 and 6 using fluorine atom-containing polymers beyond the scope of the present invention are found to be insufficient in the uniformity of the coated films. Furthermore, each presensitized plate thus prepared was exposed to light through an image-carrying film and developed at 25° C. for 40 seconds using an automatic developing machine 800U (available from Fuji Photo Film Co., Ltd.) and an automatic developer DP-4 (1:8) (available from the same company). Then a gum (GP) (available from the same company) was applied to the developed plate and printing was carried out using the plate thus formed after one week to thus determine the ink-receptivity in terms of the number of printed matters obtained till the ink was completely adhered to the plate surface. As a result, it was found that the products of Comparative Examples 5 and 6 were inferior in the ink-receptivity.

Each of the light-sensitive lithographic printing plates prepared in Examples 16 to 20 was subjected to contact exposure with an original film and then developed with a developer for positive plates. As a result, it was found that these lithographic printing plates were excellent in both the sensitivity and the ability of reproducing the original pattern. Printing was conducted using these lithographic printing plates and it was found that they were excellent in both the printing durability and the uniformity of image strength.

EXAMPLE 21 AND COMPARATIVE EXAMPLES 8 AND 9

The surface of an aluminum plate of quality 1S having a thickness of 0.30 mm was grained with a number 8 nylon brush and an aqueous suspension of 800 mesh pumice stone and then the plate was sufficiently washed with water. The plate was then etched by immersing in a 10% sodium hydroxide solution at 70° C. for 60 seconds, washed with running water, neutralized and rinsed with a 20% $HNO_3$ solution and then washed with water. The plate was then subjected to an electrolytic surface-roughening treatment in a 1% nitric acid aqueous solution at the quantity of anode time electricity of 300 coulomb/$dm^2$ using a sinusoidal alternating waved current under the condition of VA=12.7 V. At this stage, the surface-roughness thereof was determined and it was found to be 0.45 $\mu$m (as expressed in terms of Ra). Subsequently, the plate was desmutted by immersing it in a 30% sulfuric acid aqueous solution at 55° C. for 2 minutes, a cathode was placed on the grained surface of the plate in a 20% sulfuric acid aqueous solution at 33° C. and the plate was anodized at a current density of 5 A/$dm^2$ for 50 seconds. The thickness of the anodized film thus formed was determined and found to be 2.7 g/$m^2$.

Further the plate was immersed in a 2.5% by weight aqueous solution of No. 3 sodium silicate ($SiO_2$=28~30%; $Na_2O$=9~10%; Fe=not more than 0.02%) having a pH value of 11.2 and maintained at 70° C. for 13 seconds and then washed with water. At this stage, the amount of silicate deposited was found to be 10 mg/$m^2$. This was determined by the fluorescent X-ray analysis in terms of the amount of elemental Si. Then a liquid composition (sol) for the SG method was prepared according to the following procedures. The following composition was weighed out in a beaker and stirred at 25° C. for 20 minutes.

| (Composition of Sol) | |
|---|---|
| Component | Amt. (g) |
| $Si(OC_2H_5)_4$ | 38 |
| 3-Methacryloxypropyl trimethoxysilane | 13 |
| 85% phosphoric acid aqueous solution | 12 |
| Ion-exchanged water | 15 |
| Methanol | 100 |

The solution was transferred to a 3-necked flask, a reflux condenser was fitted to the flask and the flask was then immersed in an oil bath maintained at room temperature. The temperature of the contents in the flask was raised up to 50° C. over 30 minutes, while stirring them using a magnetic stirrer. The contents were further reacted for one hour while maintaining the bath temperature at 50° C. to thus give a liquid composition (sol). The resulting sol was diluted with 20/1 (weight ratio) mixture of methanol and ethylene glycol to a final concentration of 0.5% by weight, applied onto the substrate according to the whirler coating technique and then dried at 100° C. for one minute. At this stage, the coated amount thereof was found to be 4 mg/$m^2$. This coated amount was likewise determined by the fluorescent X-ray analysis and expressed in terms of the amount of elemental Si. Then a light-sensitive liquid 3 having the following composition (a photopolymerizable composition) was applied onto the aluminum plate thus processed in such a manner that the coated amount (weighed after drying) was equal to 1.5 g/$m^2$ and dried at 100° C. for one minute to thus form a light-sensitive layer.

| (Composition of Light-Sensitive Liquid 3) | |
|---|---|
| Component | Amt. (g) |
| Tetramethylolmethane tetraacrylate | 1.5 |
| Linear organic high molecular weight polymer (B1) (allyl methacrylate- methacrylic acid copolymer; copolymerization molar ratio 80/20; weight average molecular weight = 45,000) | 2.0 |
| Sensitizer (C1; having the following structure) ($\lambda_{max}$ THF 479 nm; $\epsilon$ = 6.9 × $10^4$) | 0.15 |
| Photopolymerization initiator (D1; having the following structure) | 0.2 |
| IRUGACURE 907 (E1) (available from Ciba-Geigy Company) | 0.4 |
| Fluorine atom-containing polymer (P-9) | 0.2 |
| $\epsilon$ -Phthalocyanine/(B1) dispersion | 0.2 |
| Methyl ethyl ketone | 9.0 |
| Propylene glycol monomethyl ether acetate | 7.5 |
| Toluene | 11.0 |

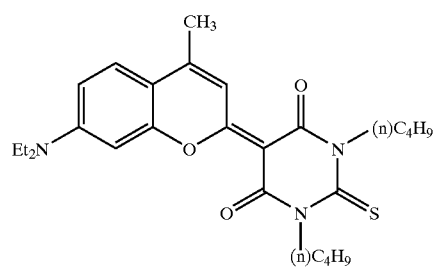

C1

-continued

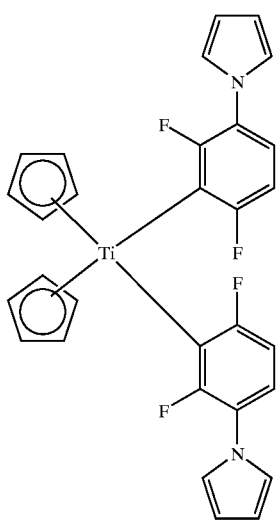

D1

A 3% by weight aqueous solution of polyvinyl alcohol (degree of saponification 98 mole %; degree of polymerization 500) was applied onto the light-sensitive layer as an oxygen barrier protective layer such that the dry weight thereof coated was equal to 2.5 g/m², dried at 120° C. for 3 minutes to give a photopolymerizable presensitized plate for lithographic printing plates. The resulting light-sensitive layer was excellent in the uniformity of the coated film (Example 21).

On the other hand, when the fluorine atom-containing polymer (P-9) was removed from the light-sensitive layer having the foregoing composition, the resulting film was uneven and non-uniform (Comparative Example 8).

Further a comparative light-sensitive liquid was also prepared according to the same procedures used above except that the foregoing R-1 was substituted for the P-9 used above. As a result, it was confirmed that the foaming ability of the light-sensitive liquid was controlled in case of the system containing P-9, while the system containing R-1 showed high foaming ability and pinholes were formed on the light-sensitive layer prepared from the R-1 containing system (Comparative Example 9) in a density of not less than 10 per unit area (1 m²).

The resulting lithographic printing plate was exposed to light, in two parts per plate, using XLP4000 (Ar laser, 75 mW, 488 nm; available from Optronics Company) under the conditions of the exposure of 4000 dpi and 175 lines/inch, every 1% over 1 to 99%. Thereafter, the plate was subjected to a post-heat treatment by exposing to 120° C. for 20 seconds.

The development of the exposed plate was conducted by immersing it in the following developer at 25° C. for 30 seconds.

| (Developer) | |
|---|---|
| No. 1K Potassium Silicate | 30 g |
| Potassium Hydroxide | 15 g |
| Water | 1000 g |

Then a gumming liquid GU-7 (available from Fuji Photo Film Co., Ltd.) was diluted two times with water and used for the gumming treatment of the plate surface. The quantity of energy reproduced on the plate surface by the 1% exposure under the conditions of the exposure of 4000 dpi and 175 lines/inch was determined as the sensitivity of each sample and as a result, it was found to be 0.2 mJ, which corresponded to practically satisfied sensitivity. Moreover, the quality of the half tone dots was excellent at that exposure value and there was not observed any unnecessary fog and flare at all. Then the test for printing durability was conducted using SORKZ available from Heidelberg Company as a printing press and KURAF G (N) available from Dainippon Ink and Chemicals, Inc. as ink and as a result, not less than 180,000 excellent printed matters were obtained (Example 21).

Furthermore, the same procedures for the exposure and development used above were repeated after the light-sensitive material was stored at 60° C. for 3 days and the stability thereof with time was visually evaluated. All of the examined printing durability, resistance to contamination and image quality were almost identical to those observed for the light-sensitive material immediately after the coating and quite excellent (Example 21).

On the other hand, a light-sensitive presensitized plate for lithographic printing plates having a light-sensitive layer in which R-1 was substituted for the P-9 used above was exposed to light and developer by the same procedures used above. As a result, it was confirmed that there were observed unnecessary fog and flare (Comparative Example 9).

EXAMPLE 22 AND COMPARATIVE EXAMPLE 10 AND 11

Then we will hereunder explain embodiments concerning the thermally cross-linkable presensitized plate for lithographic printing plates.

An aluminum plate (made of a material 1050) having a thickness of 0.30 mm was rinsed with trichloroethylene to thus degrease the same, subjected to surface-graining using a nylon brush and an aqueous suspension of 400 mesh pumice stone and then sufficiently washed with water. This plate was etched by immersing in a 25% sodium hydroxide aqueous solution maintained at 45° C. for 9 seconds, washed with water, further immersed in a 2% nitric acid solution for 20 seconds and then washed with water. At this stage, the amount of aluminum removed from the grained surface through the etching was found to be about 3 g/m². Then an anodized film was formed on this plate at a DC current density of 15 A/dm² in a 7% sulfuric acid solution as an electrolyte in an amount of 3 g/m² and then washed with water and dried.

Thereafter the following undercoating liquid 2 was applied onto the aluminum plate and dried at 80° C. for 30 seconds. The coated amount of the liquid weighed after drying was found to be 10 mg/m².

| (Undercoating Liquid 2) | |
|---|---|
| β-Alanine | 0.1 g |
| Phenyl-phosphonic acid | 0.05 g |
| Methanol | 40 g |
| Pure water | 60 g |

Then the following light-sensitive liquid 4 was prepared, the resulting liquid was applied onto the aluminum plate on which the foregoing undercoating layer had been applied and then dried at 100° C. for one minute to give a negative presensitized plate for lithographic printing plates. The coated surface condition of the light-sensitive layer was excellent and uniform and the coated amount thereof weighed after drying was found to be 1.5 g/m².

Example 22

| (Composition of Light-Sensitive Liquid 4) | |
|---|---|
| Component | Amt. (g) |
| Fluorine atom-containing polymer (P-9) | 0.05 |
| Acid-generating agent [SH-1] (having the following structure) | 0.3 |
| Crosslinking agent [KZ-1] (having the following structure) | 0.5 |
| Binder polymer [BP-1][1] | 1.5 |
| Infrared-absorbing agent [IK-1] (having the following structure) | 0.07 |
| AIZEN SPILON BLUE C-RH (available from Hodogaya Chemical Co., Ltd.) | 0.035 |
| Methyl ethyl ketone | 12 |
| Methyl alcohol | 10 |
| 1-Methoxy-2-propanol | 8 |

[1]Binder polymer [BP-1]: A poly(p-hydroxystyrene) product commercially available from Maruzen Petrochemical Co., Ltd. under the trade name of "Maruka Linker S-4P" was used as [BP-1].

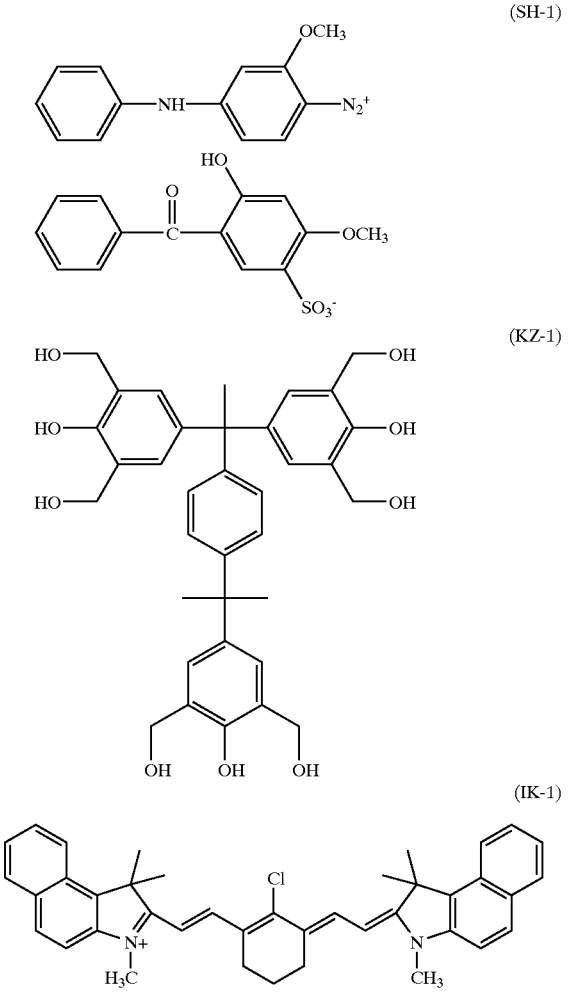

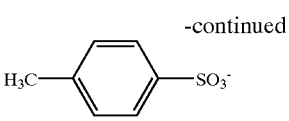

The surface of the resulting negative presensitized plate for preparing lithographic printing plates was touched with bare hands and then it was scanning-exposed to the light beam from a semiconductor laser capable of emitting infrared light rays falling within the wavelength range of from 820 to 850 nm. After the exposure, the plate was heated with a panel heater at 110° C. for 30 seconds and then developed with a developer DP-4 (diluted to a ratio of 1:8 with water) (available from Fuji Photo Film Co., Ltd.). After the formation of images, the plate was visually examined on whether the images formed on the portions touched with bare hands were slipped off or not, but it was confirmed that any image was not slipped off at all (Example 22).

Separately, 1 m² of the presensitized plate for lithographic printing plates was treated with 100 ml of the developer and the developer after the treatment was inspected for the generation of any sludge. However, there was not observed the generation of any sludge and it was thus confirmed that the presensitized plate was excellent in the solubility in the developer (Example 22).

A solution was prepared by repeating the same procedures used in Example 22 except that the use of the fluorine atom-containing polymer P-9 incorporated into the light-sensitive liquid 4 used in Example 22 was omitted. This light-sensitive liquid or solution was applied onto the undercoating layer-carrying aluminum plate used in Example 22 and then dried at 100° C. for one minute to form a negative lithographic printing plate material. The conditions of the coated surface were found to be uneven and non-uniform. Images were formed on this presensitized plate for preparing lithographic printing plates by repeating the same procedures used in Example 22. After the formation of the images, the plate was visually examined on whether the images formed on the portions touched with bare hands were slipped off or not and it was confirmed that images were distinctly slipped off (Comparative Example 10).

Moreover, a light-sensitive liquid was prepared by repeating the same procedures used in Example 22 except that R-2 was substituted for the fluorine atom-containing polymer P-9 incorporated into the light-sensitive liquid 4 of Example 22. This light-sensitive liquid was applied onto the undercoating layer-carrying aluminum plate used in Example 22 and then dried at 100° C. for one minute to form a negative lithographic printing plate material. Images were formed on this presensitized plate for preparing lithographic printing plates by repeating the same procedures used in Example 22. After the formation of the images, the plate was visually examined on whether the images formed on the portions touched with bare hands were slipped off or not and it was confirmed that images were slipped off (Comparative Example 11).

Separately, 1 m² of the presensitized plate for lithographic printing plates was treated with 100 ml of the developer and the developer after the treatment was inspected for the generation of any sludge. As a result, it was confirmed that sludge was generated and that the presensitized plate was inferior in the solubility and dispersibility in the developer.

EXAMPLE 23 AND COMPARATIVE EXAMPLES 13 AND 14

Next, we will hereunder explain embodiments of thermally positive presensitized plate for preparing lithographic printing plates.

Preparation of Copolymer 1

To a 20 ml volume 3-necked flask equipped with a stirring machine, a condenser and a dropping funnel, there were added 4.61 g (0.0192 M) of N-(p-aminosulfonyl-phenyl) methacrylamide, 2.94 g (0.0258 M) of ethyl methacrylate, 0.80 g (0.015 M) of acrylonitrile and 20 g of N,N-dimethylacetamide and the mixture was stirred while heating them in a warm water bath maintained at 65° C. To this mixture, there was added 0.15 g of "V-65" (available from WAKO Pure Chemical Co., Ltd.) and the resulting mixture was stirred for 2 hours in a nitrogen gas stream while maintaining the temperature of the mixture at 65° C. To this reaction mixture, there was further dropwise added, through the dropping funnel, a mixture containing 4.61 g of N-(p-aminosulfonylphenyl)methacrylamide, 2.94 g of ethyl methacrylate, 0.80 g of acrylonitrile, N,N-dimethylacetamide and 0.15 g of "V-65", over 2 hours.

After the completion of the dropwise addition, the resulting mixture was further stirred at 65° C. for additional 2 hours. After the completion of the reaction, 40 g of methanol was added to the reaction mixture, followed by cooling the mixture, addition of the resulting mixture to 2 liters of water with stirring, stirring the resulting mixture over 30 minutes, filtration off the precipitates formed in the mixture through filtration and then drying the precipitates to give 15 g of a white solid. The weight average molecular weight of the resulting specific copolymer 1 was determined by the gel permeation chromatography (reference material: polystyrene) and as a result, it was found to be 53,000.

An aluminum plate (made of a material 1050) having a thickness of 0.30 mm was rinsed with trichloroethylene to thus degrease the same, subjected to surface-graining using a nylon brush and an aqueous suspension of 400 mesh pumice stone and then sufficiently washed with water. This plate was etched by immersing in a 25% sodium hydroxide aqueous solution maintained at 45° C. for 9 seconds, washed with water, further immersed in a 20% nitric acid solution for 20 seconds and then washed with water. At this stage, the amount of aluminum removed from the grained surface through the etching was found to be about 3 g/m². Then an anodized film was formed on this plate at a DC current density of 15 A/dm² in a 7% sulfuric acid solution as an electrolyte in an amount of 3 g/m², washed with water, dried, coated with the following undercoating liquid 3 and dried at 90° C. for one minute. The coated amount of the liquid weighed after drying was found to be 10 mg/M².

| (Undercoating Liquid 3) | |
|---|---|
| β-Alanine | 0.5 g |
| Methanol | 95 g |
| Water | 5 g |

Furthermore the plate was treated with a 2.5% by weight aqueous solution of sodium silicate at 30° C. for 10 seconds, the following undercoating liquid 4 was applied and the coated layer was dried at 80° C. for 15 seconds to give a substrate. The coated amount of the layer weighed after drying was found to be 15 mg/m².

| (Undercoating Liquid 4) | |
|---|---|
| The following compound | 0.3 g |
| Methanol | 100 g |
| Water | 1 g |

(Molecular weight: 28,000)

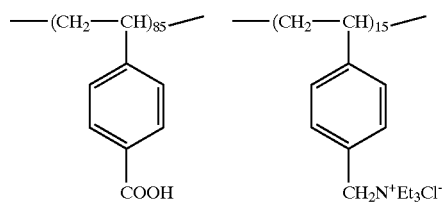

The following light-sensitive liquid 5 was prepared. The light-sensitive liquid 5 was applied onto the resulting substrate in a coated amount of 1.8 g/m² to give a presensitized plate for lithographic printing plates, excellent in the conditions of the coated surface of the light-sensitive layer (Example 23).

| (Composition of Light-Sensitive Liquid 5) | |
|---|---|
| Component | Amt. (g) |
| Fluorine atom-containing polymer (P-12) | 0.02 g |
| The foregoing copolymer 1 | 0.75 g |
| m-,p-Cresol-novolak resin (m/p ratio: 6/4, weight average molecular weight: 3,500, containing 0.5% by weight of unreacted cresol) | 0.25 g |
| p-Toluene-sulfonic acid | 0.003 g |
| Tetrahydrophthalic acid anhydride | 0.03 g |
| Cyanine dye (IK-1) | 0.017 g |
| A dye obtained by exchanging the counter-ions of Victoria Pure Blue BOH for 1-naphthalene-sulfonic acid anions | 0.015 g |
| γ-Butyrolactone | 10 g |
| Methyl ethyl ketone | 10 g |
| 1-Methoxy-2-propanol | 1 g |

The resulting presensitized plate for lithographic printing plates was evaluated for the development stability against any external defect according to the following method. Using a continuous load-type scratch resistance-testing machine "SB62 Type" (available from Shinto Kagaku Co., Ltd.), paper filter "No. 5C" (available from Advantech Toyo Co. Ltd.) was adhered to a square flat portion (1 cm square) on a scratching tool, which came in contact with the plate surface and the light-sensitive layer side of the presensitized plate was scratched at a velocity of 6 cm/sec while adding a load of 100 g to the scratching tool. Then the scratched presensitized plate was imagewise exposed so as to have 5% half tone dot pattern at a main scanning speed of 5 m/sec, using a semiconductor laser having a power of 500 mW, a beam wavelength of 830 nm and a beam diameter of 17 μm (1/e²) and the imagewise exposed plate was developed with a developer DP-4 (1:8) (available from Fuji Photo Film Co., Ltd.) for 30 seconds. The resulting plate had an excellent half tone dot pattern, images formed on the scratched portion were never dissolved in the developer and it was thus confirmed that the lithographic printing plate according to the present invention showed excellent development stability against external defects. Moreover, the foaming ability of the light-sensitive liquid was quite low and the condition of the coated surface was found to be quite good such that the pinhole density was found to be not more than 5/m² (Example 23).

Separately, 1 m² of the presensitized plate for lithographic printing plates was entirely exposed to light, treated with 100 ml of the developer and the developer after the treatment was inspected for the generation of any sludge. As a result, it was confirmed that sludge was not generated at all and that the presensitized plate was excellent in the solubility in the developer.

A presensitized plate for lithographic printing plate was prepared by repeating the same procedures used in Example 23 except that any fluorine atom-containing polymer was not used. As a result, the surface condition of the resulting light-sensitive layer was found to be uneven and non-uniform. Then this presensitized plate was inspected for the development stability against external defects according to the same procedures used in Example 23. As a result, it was confirmed that unexposed half tone dot pattern on the scratched portions of the plate, on which images were naturally formed, was removed through the development (Comparative Example 14).

Separately, 1 m² of the presensitized plate for lithographic printing plates was entirely exposed to light, treated with 100 ml of the developer and the developer after the treatment was inspected for the generation of any sludge. As a result, it was confirmed that the generation of sludge was distinctly observed and that the presensitized plate was inferior in the solubility and dispersibility in the developer.

As will be clear from the results observed in Example 23 and Comparative Examples 13 and 14, the addition of a specific fluorine atom-containing polymer permits the preparation of a light-sensitive liquid capable of providing excellent surface conditions, the resulting light-sensitive layer is improved in the resistance to external defects prior to the development, is excellent in the solubility and dispersibility in the developer and does not cause the generation of any sludge.

EXAMPLE 24 AND COMPARATIVE EXAMPLES 15 AND 16

Then we will hereunder explain embodiments of a radical polymerizable and thermally negative presensitized plate for preparing lithographic printing plates.

A molten metal of JIS A 1050 alloy containing not less than 99.5% aluminum, 0.30% Fe, 0.10% Si, 0.02% Ti and 0.013% Cu was subjected to a cleaning treatment and then casted. The cleaning treatment included a degassing treatment for removing unnecessary gases such as hydrogen gas in the melt and a treatment with a ceramic tube filter. The casting was conducted according to the DC casting method. The solidified ingot having a thickness of 500 nm was converted into a rolled aluminum plate of 10 nm. The center line average surface roughness Ra of the aluminum plate after the cold rolling was controlled to 0.2 μm by adjusting the roughness of the rolling rolls. Thereafter the plate was subjected to tension leveling for the improvement of the flatness thereof.

Then the plate was surface-treated to give a substrate for lithographic printing plate. First of all, the aluminum plate was degreased by treating with a 10% aqueous solution of sodium aluminate at 50° C. for 30 seconds in order to remove any rolling oil from the surface thereof, neutralized with a 30% sulfuric acid aqueous solution at 50° C. for 30 seconds and then subjected to desmutting.

Then the plate or the substrate was subjected to a surface-roughening treatment or the so-called surface-graining treatment for improving the adhesion between the substrate and a light-sensitive layer and for imparting water retention characteristics to non-image areas. An aqueous solution containing 1% nitric acid and 0.5% aluminum nitrate was maintained at 45° C., aluminum webs were electrolytically grained by applying an electric current at a current density of 20 A/dm² using an indirect power supply cells so as to ensure the quantity of electricity at the anode side of 240 coulomb/dm² using an alternating waved current having a duty ratio of 1:1, while passing the webs through the aqueous solution. Thereafter, the web was etched by immersing in a 10% sodium aluminate aqueous solution at 50° C. for 30 seconds, neutralized with a 30% sulfuric acid aqueous solution at 50° C. for 30 seconds and then desmutted.

Moreover, the web was anodized to form an anodized film on the substrate for the improvement of the wear resistance, resistance to chemicals and water retention characteristics. More specifically, the aluminum web was continuously passed through a 20% sulfuric acid aqueous solution as an electrolyte and electrolyzed by applying an electric current at a DC current density of 20 A/dm² using an indirect power supply cells to thus form an anodized film thereon in an amount of 2.5 g/m².

Then the following undercoating liquid 5 was applied onto this aluminum substrate with a wire bar such that the coated amount of the dry solid content was equal to 5 mg/m² and then dried in a hot air dryer at 90° C. for 30 seconds.

| (Undercoating Liquid 5) | |
| --- | --- |
| 2-Aminoethyl-phosphonic acid | 0.1 g |
| Phenyl-phosphonic acid | 0.1 g |
| Methanol | 75 g |
| Water | 25 g |

Then the following light-sensitive liquid 6 (a coating liquid for forming a light-sensitive layer) was applied to the foregoing undercoating layer-carrying substrate with a wire bar and then dried in a hot air dryer at 115° C. for 45 seconds to give a negative presensitized plate for forming lithographic printing plates. The condition of the coated surface of the presensitized plate was excellent in the uniformity and the coated amount of the light-sensitive liquid was 1.3 g/m² (Example 24).

| (Composition of Light-Sensitive Liquid 6) | |
| --- | --- |
| Component | Amt. (g) |
| Light-Heat Conversion Agent (Cyanine dye TN-1 having the following Structure) | 0.10 |
| Thermally radical-generating agent (sulfonium salt compound TN-2 having the following structure) | 0.30 |
| Addition-polymerizable unsaturated compound (dipentaerythritol hexaacrylate) | 1.00 |
| Alkali-soluble binder polymer (a copolymer of allyl methacrylate and methacrylic acid, having a copolymerization molar ratio of 83:17 and a weight average molecular weight of 125,000) | 1.2 |
| Coloring agent (Naphthalene-sulfonic acid salt of Victoria Pure Blue) | 0.04 |
| Fluorine atom-containing polymer (P-20) | 0.005 |
| Methyl ethyl ketone | 10.0 |
| Water | 8.0 |

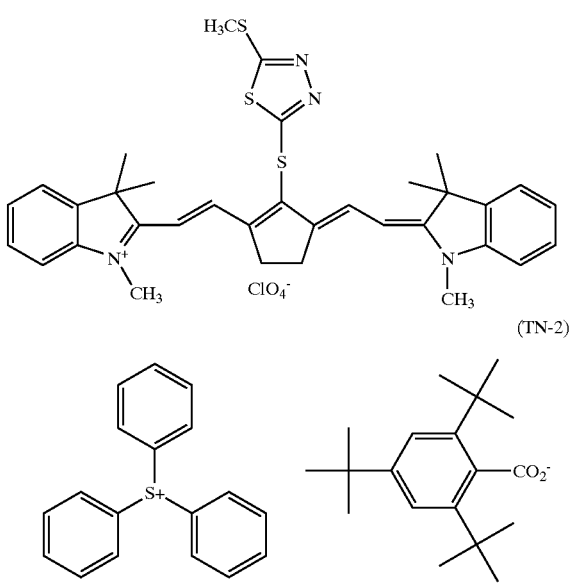

The resulting negative presensitized plate for lithographic printing plate was exposed to light to form 50% half tone dot images using Trendsetter 3244VF available from Creo Company and equipped with a water-cooled 40W infrared semiconductor laser under the following conditions: an output of 9W; a rotational frequency of the outer drum of 210 rpm, a reverse side energy of 100 mJ/cm$^2$; and a resolution of 2400 dpi.

Then the imagewise exposed plate was developed using an automatic developing machine STABRON 900N (available from Fuji Photo Film Co., Ltd.). The developer and replenisher used were those having the following compositions, respectively, the temperature of the developing bath was set at 30° C., and the finisher used was FN-6 (available from Fuji Photo Film Co., Ltd.) diluted with water (1:1, pH=10.8). As a result, there were obtained uniform and excellent half tone dot images. The resulting lithographic printing plate was fitted to a printing press HEIDEL SOR-M (available from Heidelberg Company) to carry out printing operations. Thus, printed matters of not less than 110,000 were obtained. Moreover, the light-sensitive liquid used in this example had a low foaming ability, the time required for suppressing foams was found to be not more than 5 minutes and the surface condition of the light-sensitive layer was also found to be excellent (pinhole density=5/m$^2$) (Example 24).

Separately, 1 m$^2$ of the presensitized plate for lithographic printing plates was entirely exposed to light, treated with 100 ml of the developer and the developer after the treatment was inspected for the generation of any sludge. As a result, it was confirmed that sludge was not generated at all and that the presensitized plate was excellent in the solubility in the developer.

A presensitized plate for preparing lithographic printing plates was prepared by repeating the same procedures used in Example 24 except that the fluorine atom-containing polymer was omitted from the foregoing light-sensitive liquid. As a result, it was found that the light-sensitive layer thus obtained was insufficient in the uniformity. Moreover, the presensitized plate was subjected to the same light-exposing and developing treatments used in Example 24 and it was thus confirmed that defects were formed on the portions carrying half tone dot images (Comparative Example 15).

The same procedures used in Example 24 were repeated except that R-1 was substituted for the fluorine atom-containing polymer used in the foregoing light-sensitive liquid to form a presensitized plate for preparing a lithographic printing plate. The resulting light-sensitive liquid had a high foaming ability, the time required for suppressing foams was found to be not less than 30 minutes and the light-sensitive liquid was quite insufficient in the production properties. The resulting light-sensitive layer was found to be insufficient in the uniformity. Moreover, the presensitized plate was subjected to the same light-exposing and developing treatments used in Example 24 and it was thus confirmed that defects were formed on the portions carrying half tone dot images (Comparative Example 16).

Separately, 1 m$^2$ of the presensitized plate for preparing a lithographic printing plate was entirely exposed to light, treated with 100 ml of the developer and the developer after the treatment was inspected for the generation of any sludge. As a result, it was confirmed that sludge was clearly generated and that the presensitized plate was inferior in the solubility and dispersibility in the developer.

It will be clear from the results obtained in Example 24 and Comparative Example 15 and 16 that the use of the fluorine atom-containing polymer according to the present invention would permit the formation of a light-sensitive layer having uniform surface condition, the preparation of a thermally negative lithographic printing plate whose image areas are improved in the resistance to developer and that the light-sensitive layer is excellent in the solubility and dispersibility in the developer and is thus never accompanied by the generation of any sludge.

As has been described above in detail, the present invention permits the formation of a light-sensitive layer having uniform surface condition without causing abnormality in the surface quality due to the foaming phenomenon observed during the production and also permits the production of a positive light-sensitive resin composition having excellent solubility and dispersibility in a developer.

Moreover, it has been found that the use of the specific fluorine atom-containing polymer according to the present invention would permit the improvement of the resulting presensitized plate for preparing a lithographic printing plate not only in the foregoing surface quality and solubility in the developer, but also in the gradation for the negative type one and permit the improvement of the presensitized plate in the sensitivity to laser beams and resistance to fogging caused due to scattering and reflected light rays, in case of, in particular, a laser light-sensitive photopolymerizable printing plate and thus permit the preparation of a lithographic printing plate having high printing durability.

Moreover, it has also been found that the use of the foregoing polymer would permit the preparation of a heat-sensitive presensitized plate for preparing a lithographic printing plate improved not only in the foregoing surface quality and solubility in the developer, but also in the discrimination and the strength of images and therefore, permit the preparation of a printing plate, which never causes any missing of images on the portions touched with the bare hands and which is improved in the stability or resistance to any external defect.

What is claimed is:
1. A presensitized plate for preparing a lithographic printing plate, which comprises a substrate provided thereon with a light-sensitive layer containing a fluoro-aliphatic group-containing copolymer prepared by copolymerizing at least the following monomers (A) and (B):

(A) an addition polymerizable monomer having, on a side chain, a fluoro-aliphatic group in which hydrogen atoms are replaced with fluorine atoms; and (B) a (meth)acrylate having an ester chain represented by the following general formula (I) or (II):

$$CH_2=C(R^1)-CO-O-R^2-O-(CO-R^3-O)_n-R^4 \quad (I)$$

$$CH_2=C(R^1)-CO-(O-R^3-CO)_n-O-R^4 \quad (II)$$

(In the formulas, $R^1$ represents —H or —$CH_3$; $R^2$ and $R^3$ each independently represents an alkylene group having 1 to 12 carbon atoms; $R^4$ represents a hydrogen atom or a substituted or unsubstituted alkyl group having 1 to 12 carbon atoms, cycloalkyl group, aryl group, aralkyl group or heterocyclic group wherein the substituent on the group of $R^4$ is selected from the group consisting of alkyl or alkoxy group having 1 to 6 carbon atoms and n is a number ranging from 1 to 50).

2. The presensitized plate for preparing a lithographic printing plate of claim 1, wherein (A) the addition polymerizable monomer is a vinyl monomer carrying a radical polymerizable unsaturated group having, on a side chain, a fluoro-aliphatic group in which hydrogen atoms are replaced with fluorine atoms.

3. The presensitized plate for preparing a lithographic printing plate of claim 2, wherein the vinyl monomer is an acrylate or methacrylate compound represented by the general formula: Rf—R'—OOC—C(R")=$CH_2$ (wherein R' represents a single bond, an alkylene group, a sulfonamide-alkylene group or a carbonamide-alkylene group; R" represents a hydrogen or halogen atom or a methyl group; and Rf represents a perfluoro-aliphatic group).

4. The presensitized plate for preparing a lithographic printing plate of claim 1, wherein $R^2$ and $R^3$ each independently represents an alkylene group having 2 to 6 carbon atoms, and $R^4$ represents a hydrogen atom or a substituted or unsubstituted alkyl group having 1 to 6 carbon atoms.

5. The presensitized plate for preparing a lithographic printing plate of claim 3, wherein $R^2$ and $R^3$ each independently represents an alkylene group having 2 to 6 carbon atoms, and $R^4$ represents a hydrogen atom or a substituted or unsubstituted alkyl group having 1 to 6 carbon atoms.

6. The presensitized plate for preparing a lithographic printing plate of claim 1, wherein the amount of the fluoro-aliphatic group-containing monomer (A) is in the range of 5 to 90% by weight on the basis of the total weight of the monomers constituting the fluorine atom-containing polymer and the weight average molecular weight of the fluorine atom-containing polymer ranges from 3,000 to 200,000.

7. The presensitized plate for preparing a lithographic printing plate of claim 1, wherein the amount of the fluorine atom-containing polymer ranges from 0.005 to 8% by weight on the basis of the amount of the light-sensitive resin composition for forming the light-sensitive layer.

8. The presensitized plate for preparing a lithographic printing plate of claim 1, wherein an additional monomer copolymerizable with the monomers (A) and (B) is used for the preparation of fluoro-aliphatic group-containing copolymer, which the additional monomer is selected from the group consisting of acrylic acid, methacrylic acid, acrylic acid esters, methacrylic acid esters, acrylamides, methacrylamides, allyl compounds, vinyl ethers and vinyl esters.

9. A method for preparing a lithographic printing plate, which comprises imagewise exposing the presensitized plate of claim 1 to light and then developing the exposed plate with a developer.

10. The method of claim 9, wherein the developer comprises (a) at least one saccharide selected from non-reducing saccharides and (b) at least one base and having a pH value ranging from 9.0 to 13.5.

* * * * *